(12) United States Patent
Fedynyshyn et al.

(10) Patent No.: US 8,551,566 B2
(45) Date of Patent: Oct. 8, 2013

(54) DIRECTED MATERIAL ASSEMBLY

(75) Inventors: Theodore H. Fedynyshyn, Sudbury, MA (US); Richard Kingsborough, North Chelmsford, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 581 days.

(21) Appl. No.: 12/707,129

(22) Filed: Feb. 17, 2010

(65) Prior Publication Data
US 2011/0039061 A1 Feb. 17, 2011

Related U.S. Application Data

(60) Provisional application No. 61/153,715, filed on Feb. 19, 2009.

(51) Int. Cl.
*B05D 3/00* (2006.01)
*B05D 3/06* (2006.01)

(52) U.S. Cl.
USPC ............................ 427/264; 427/555; 427/552

(58) Field of Classification Search
USPC ................. 427/264, 265, 266, 532, 551, 552, 427/553, 554, 555
See application file for complete search history.

(56) References Cited

U.S. PATENT DOCUMENTS

| | | | |
|---|---|---|---|
| 6,746,825 B2 | 6/2004 | Nealey et al. | |
| 6,822,833 B2 | 11/2004 | Yang et al. | |
| 6,926,953 B2 | 8/2005 | Nealey et al. | |
| 2004/0175628 A1 | 9/2004 | Nealey et al. | |
| 2006/0134556 A1 | 6/2006 | Nealey et al. | |
| 2012/0040872 A1* | 2/2012 | Zhou ............................... | 506/32 |

FOREIGN PATENT DOCUMENTS

| | | | |
|---|---|---|---|
| KR | 20090015742 A | | 2/2009 |
| KR | 20090015742 A | * | 2/2009 |

OTHER PUBLICATIONS

Ruckenstein et al, Surface Modification and Functionalization through the Self-Assembled Monolayer and Graft Polymerization, 2005, Advances in Colloid and Interface Science, 113, pp. 43-63.*
International Search Report and Written Opinion, Application No. PCT/US20101024412, dated Dec. 6, 2010.

(Continued)

*Primary Examiner* — Dah-Wei Yuan
*Assistant Examiner* — Nga Leung V Law
(74) *Attorney, Agent, or Firm* — Thomas J. Engellenner; Reza Mollaaghubeba; Pepper Hamilton LLP

(57) ABSTRACT

Methods of directing assembly of materials using a surface-modified substrate are disclosed. A modified surface is created on a substrate by applying a first surface agent to the substrate. Energy is applied to the modified surface to form an imaged surface having an imaged portion and a non-imaged portion. The imaged portion is characterized by a surface energy that is different from the surface energy of the non-imaged portion. For example, the applied energy can remove at least a portion of an attached surface agent from the imaged portion to modify the surface energy. In some preferred embodiments the energy also modifies the surface agent without causing oxidation. To avoid oxidation, for example, the surface modification and/or energy appliement can take place in a low oxygen environment (e.g., having an oxygen content lower than that present in about 0.01 Torr of air). The imaged surface can then be exposed to a self assembling material, such as a block copolymer, such that the surface can direct assembly of the self assembling material by preferential attachment of certain moieties of the block copolymer to imaged or non-imaged portions of the surface in order to form a selected pattern.

34 Claims, 6 Drawing Sheets

(56) References Cited

OTHER PUBLICATIONS

Bates, FS et al., "Block copolymers—designer soft materials," Physics Today, Feb. 1999, pp. 32-38.
Black, CT et al. "Polymer self-assembly as a novel extension to optical lithography," ACSNANO 1(3):147-50 (2007).
Black, CT et al, "Self assembly in semiconductor microelectronics: self-aligned sub-lithographic patterning using diblock copolymer thin films," Proc of SPIE 6153-515302 (2006).
Cheng, JY et al. "Templated self-assembly of block copolymers: top-down helps bottom-up," Adv. Mater. 18-2505-21 (2006).
Daoulas, KC et al., "Directed copolymer assembly on chemical substrate patterns: a phenomenological and single-chain-in-mean-field simulations study of the influence of roughness in the substrate pattern," Langmuir 24:1284-95 (2008).
DARPA AMTP presentation on Sep. 9, 2008.
Edwards, EW et al., "Dimensions and shapes of block copolymer domains assembled on lithographically defined chemically patterned substrates," Macromolecules 40:90-96 (2007).
Edwards, EW et al., "Long-range order and orientation of cylinder-forming block polymers on chemically nanopatterned striped surfaces," Macromolecules 39:3598-3607 (2006).
Edwards, EW et al., "Mechanism and kinetics of ordering in diblock copolymer thin films on chemically nanopatterned substrates," J. Poly. Sci.: Polymer Phys. 43:3444 (2005).
Edwards, EW et al., "Binary blends of diblock copolymers as an effective route to multiple length scales in perfect directed self-assembly of diblock copolymer thin films," J. Vac. Sci. Tech. B 24:340 (2006).
Fryer, DS et al, "Dependence of the glass transition temperature of polymer films on interfacial energy and thickness," Macromolecules 34:5627-34 (2001).
In, I et al., "Side-chain-grafted random copolymer brushes as neutral surfaces for controlling the orientation of block copolymer microdomains in thin films," Langmuir 22:7855-60 (2006).
Ingall, MD et al., "Surface functionalization and imaging using monolayers and surface-grafted polymer layers," J.Am.Chem.Soc. 121:3607-613 (1999).
Kim et al., "Chemical modification of self-assembled monolayers by exposure to soft x-rays in air." J. Chem. Phys. B 104:7403-10 (2000).
Kim, SO et al., "Defect structure in thin films of a lamellar block copolymer sef-assembled on neautral homogenous and chemically nanopatterned surfaces," Macromolecules 39:5466-70 (2006).
Kim, SO et al., "Epitaxial self-assembly of block copolymers on lithographically defined nanopatterned substrates," Nature 424:411-14 (2003).
Kingsborough, RP et al., "Lithographically directed materials assembly," Alternative Lithographic Technologies, Ed. Frank M. Schellenberg & Bruno M. LaFontaine, San Jose. CA, USA:SPIE, 2009. 72712D-10. © 2009 SPIE—The International Society for Optical Engineering.
Peters, RD et al., "Morphology of thin films of diblock copolymers on surfaces micropatterned with regions of different interfacial energy," Macromolecules 35:1822-34 (2002).
Peters, RD et al., "Using self-assembled monolayers exposed to x-rays to control the wetting behavior of thin films of diblock copolymers," Langmuir 16:4625-31 (2000).
Son, JG et al, "Surfactant-assisted orientation of thin diblock copolymer films," Adv Mat. 20:3643 (2008).
Stoykovcih, MP et al., "Directed self-assembly of block copolymers for nanolithography: fabrication of isolated features and essential integrated circuit geometrics," ACSNANO 1(3):168 (2007).
Stoykovich, MP et al., "Directed assembly of block copolymer blends into nonregular device-oriented structures". Science 308:1442 (2005).
Walton, DG et al., "A free energy model for confined diblock copolymers," Macromolecules 27:6225-28 (1994).
Welander, AM et al., "Rapid directed assembly of block copolymer films at elevated temperatures," Macromol 41:2759-61 (2008).
Yang, XM et al., "Guided self-assembly of symmetric diblock copolymer films on chemically nanopatterned substrates," Macromolecules 33:9575-82 (2000).

\* cited by examiner

DIRECTED MATERIAL ASSEMBLY

CROSS REFERENCE TO RELATED APPLICATIONS

The present application claims the benefit of a U.S. Provisional Patent Application bearing Ser. No. 61/153,715, filed Feb. 19, 2009, entitled "Directed Material Assembly," the entire contents of which are hereby incorporated by reference herein.

STATEMENT REGARDING FEDERALLY SPONSORED RESEARCH OR DEVELOPMENT

This invention was made with U.S. government support under Air Force contract number FA8721-05-C-0002. The government has certain rights in the invention.

FIELD OF THE APPLICATION

The present application relates to directing assembly of materials, including preparing substrates to perform directed assembly thereon.

BACKGROUND

Optical lithography at UV wavelengths is the standard process for patterning 65-nm state-of-the-art devices in the semiconductor industry, and extensions to 32-nm and below are currently being explored. Advanced lithographic schemes are focused on the use of short wavelength (193 nm or 157 nm), coupled with immersion to further reduce the effective wavelength. Alternate approaches employ higher energy actinic radiation such as extreme ultraviolet (EUV) at 14.4 nm or high voltage electron beams to further improve lithographic resolution.

Mass-produced semiconductor manufacturing entered the era on nanopatterning with UV optical lithography when the smallest feature sizes crossed the 100-nm threshold. In the last two years advanced devices have had their half-pitch at 65 nm using 193-nm dry exposures, and it is widely expected to extend to 45-nm half-pitch by incorporating liquid immersion. According to the international roadmap for semiconductors (ITRS) this trend will continue unabated for at least one more decade with expected resolution decreasing to 45 nm in 2010, 32 nm in 2013, and 22 nm in 2016.

All manufacturing of integrated circuits (ICs) has been enabled by high-performance spin-on organic polymeric photoresists. The development of polyhydroxystyrene based resists was necessary to overcome high novolac absorbance at 248 nm and enable the introduction of 248 nm lithography into IC manufacturing. In a similar manner, 193-nm lithography required the development of a new methacrylate-based polymer system to overcome the high 193-nm absorbance of phenolic-based polymers. Due to the high absorbance at 157 nm of polyhydroxystyrene, polyacrylate, and polycyclic copolymer based resists, the use of any of these resists will only be possible if the coated resist thickness is under 100 nm. This has led to the development of fluorinated polymers as resist materials capable of high resolution. Liquid immersion lithography to a large extent will be able to utilize the same types of photoresists as employed in dry lithography although there are concerns about leaching of chemicals from the photoresists and the effect of that leaching on resist resolution and optical lens contamination. EUV and electron beam are also expected to employ resists similar to those described for other wavelengths.

The constant reduction in desired resolution has place significant strains on the performance of organic polymeric resists. These resists have only limited success in sub-32 nm patterning due to their high levels of line width roughness (LWR), reduced sensitivity, and general resolution failure. This loss of resolution has been explained by diffusion of the photoacid. The initial distribution of the exposure-generated acid can diffuse outside of the patterned area; reduce the latent image chemical contrast, and effectively blurring the final resist image which leads to reduced resist resolution.

Accordingly, a need exists for techniques and materials that can aid in overcoming the problems associated with using, and enhancing the performance of, resists in patterning nanosized features for applications such as electronics manufacturing.

SUMMARY

Methods of directing assembly of materials using a surface-modified substrate are disclosed. A modified surface is created on a substrate by applying a first surface agent to the substrate. Energy is applied to the modified surface to form an imaged surface having an imaged portion and a non-imaged portion. The imaged portion is characterized by a surface energy that is different from the surface energy of the non-imaged portion. For example, the applied energy can remove at least a portion of an attached surface agent from the imaged portion to modify the surface energy. In some preferred embodiments the energy also modifies the surface agent without causing oxidation. To avoid oxidation, for example, the surface modification and/or energy application can take place in a low oxygen environment (e.g., having an oxygen content lower than that present in about 0.01 Torr of air). The imaged surface can then be exposed to a self assembling material, such as a block copolymer, such that the surface can direct assembly of the self assembling material by preferential attachment of certain moieties of the block copolymer to imaged or non-imaged portions of the surface in order to form a selected pattern.

Optionally, a second surface agent can be applied to the imaged and non-imaged portions of the modified surface, where the second surface agent can preferentially adhere to either the imaged or non-imaged portion creating another surface energy. In such instances, energy can be applied on at least a portion of the surface having the second surface agent, which can create yet another surface energy. Additional surface agents can also be applied, optionally with additional exposures of energy, to further define the selected pattern.

The selected pattern can have a number of different characteristics. In some instances, the selected pattern is based upon at least one of the energy of the imaged portion and the energy of the non-imaged portion. The selected pattern can correspond with at least one of the imaged portion and the non-imaged portion. Optionally, the selected pattern formed by the self assembling material can exhibit a first pitch and the second surface agent applied to the modified surface can exhibit a second pitch, where the second pitch is larger than the first pitch. In some instances, the selected pattern can exhibit a substantially uniform block copolymer morphology. As well, the selected pattern can exhibit a selected defect number density (e.g., lower than about one per square micrometer). When block copolymers are utilized, the block copolymer can exhibit a structure having an axis of symmetry oriented substantially perpendicular to a surface of the substrate. Such structures can include lamellae and/or cylinders.

The types of energy that can be applied on a surface modified material can include any form suitable for directing self assembly of a material. Examples include radiation, electron beams, and ion beams. When radiation is utilized, the energy can be in the form of x-rays, EUV, or radiation exhibiting at least one wavelength greater than about 140 nm. In some instances, the energy can be characterized by a wavelength greater than about 190 nm (e.g., about 193 nm or about 248 nm). In such cases, it can be advantageous to utilize a surface agent that includes an aryl group—though such groups may also be advantageous when other energy forms are utilized.

Various types of surface agents can be utilized with aspects of the present invention. In some instances the surface agents can be non-polymeric and/or comprise a silicon-containing agent capable of bonding to a substrate surface that is either modified or unmodified. Surface agents, which include the silicon-containing types, can include any number of organic moieties, such as aryl entities and/or substituted aliphatic entities.

In some particular embodiments, a silicon-containing agent can include a portion consistent with at least one of the following structural formulas:

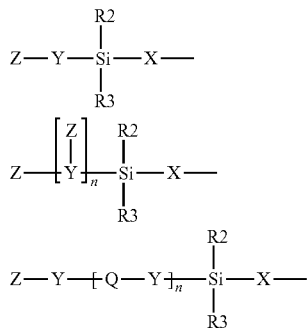

where

R2 and R3 are each independently any one of F, Cl, Br, I, OH, OM, OR, R, $NR_2$, $SiR_3$, NCO, CN, or OCOR;

M is a metal atom;

X is either NR or O;

n is an integer having a value of 1 or greater;

each Q is independently any one of O, NR, $SiR_2$, (O)CO, (N)CO, PR, POR, S, SS, $SO_2$, or $SO_3$;

each R is independently any one of an alkyl group, a vinyl group, an aryl group, a hydrogen, a haloalkyl group, a halovinyl group, or a haloaryl group;

each Y is independently any one of an alkyl group, a vinyl group, an aryl group, a silane, a siloxane, a haloalkyl group, a halovinyl group, or a haloaryl group; and each Z is independently any one of F, Cl, Br, I, OH, OM, OR, R, $NR_2$, $SiR_3$, NCO, CN, OCOR, NCOR, $PR_2$, PROR, $P(OR)_2$, SR, SSR, $SO_2R$, or $SO_3R$.

When surface agents consistent with any of the above formulas are utilized, energy can remove at least a portion of the agent by breaking the bond between the silicon atom and another atom. Thus, in some instances, the portion of a surface agent that is removed can include any of R2, R3, (Z—Y), (Z—[Z—Y]$_n$), and (Z—Y-[Q-Y]$_n$).

Other embodiments are directed to self assembling structures, which in some instances can be formed using various of the techniques disclosed herein. Such structures can include a substrate having a surface modified by a surface agent. Any of the surface agents described herein can be utilized. The modified surface can imaged portions and non-imaged portions, the imaged portions characterized by a first surface energy and the non-imaged portions characterized by a second surface energy. In some instances, the modified surface can include three or more different surface energies. A block copolymer, or other self assembling material, can be assembled on the substrate to form a selected pattern based upon at least one of the first surface energy and the second surface energy. The selected pattern exhibiting a defect number density lower than about 1 per square micrometer, and/or include any combination of the features previously described.

BRIEF DESCRIPTION OF THE DRAWINGS

The present application will be more fully understood from the following detailed description taken in conjunction with the accompanying drawings (not necessarily drawn to scale), in which.

DETAILED DESCRIPTION OF SOME EMBODIMENTS

Figure 1:
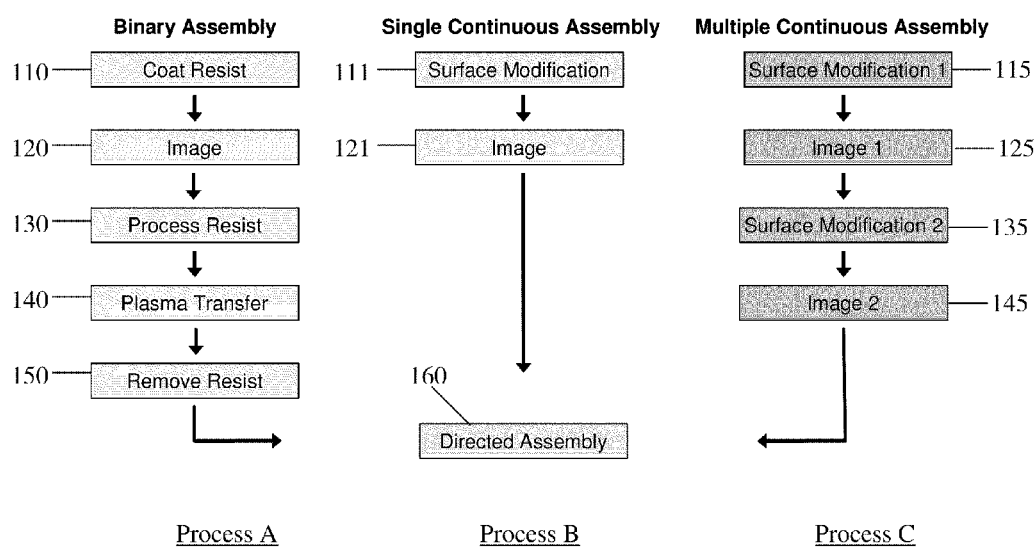
FIG. 1 depicts a flow diagram of three processes for directing assembly of self assembling materials, in accord with some embodiments of the present invention.

Methods and compositions for directing assembly of materials are disclosed. Some techniques utilize surface agents (e.g., non-polymeric materials), which can be exposed to a pattern of energy to create a plural energetic surface. Materials capable of self assembly, such as block copolymers, can then be contacted with the plural energetic surface. The characteristics of the plural energetic surface and the block copolymers, can lead to self assembly of the block copolymers on the surface, resulting in a selected pattern. Accordingly, such methods and compositions can aid in the formation of structures (e.g., features having sizes in a range from about 1 nm to about 1 micrometer) on a substrate without the need for applying, lithographically imaging, and developing typical organic resist materials. As well, in some instances, the self assembled pattern can result in patterns with very low defect densities and/or uniform block copolymer conformations with in a selected portion of a pattern.

The development of resistless techniques for directing self assembly of materials can accrue several potential advantages. The current industry consensus on lithography exposure tool potential solutions for patterning through the 16 nm DRAM half-pitch node, suggests that EUV and innovative 193 nm optical immersion technologies will dominate between the 32 nm and the 22 nm technology nodes. At the 22 nm technology node, the industry recognizes a need to consider innovative patterning options as no current lithography approach appears to be capable of producing sub-22 nanometer features with the required linewidth roughness (LWR). It has been suggested that acid diffusion in all current and future resists will limit resist resolution to about 25-nm. Even at this resolution resists are not close to meeting the industry requirement of LWR of less then 0.5 nm.

Lithographically directed self assembly has two potential large advantages over traditional resist based lithography. One advantage is that the resolution is defined by the thermodynamic properties of the self assembling material, and not the chemistry of the resist. The type and molecular weight of the polymer blocks, for example, are the only resolution defining properties of the material. These properties can be manipulated to give sub-10 nm patterning. The factors that limit traditional resist resolution and LWR such as polymer molecular weight, acid diffusion, and photoacid generator segregation are not present in self assembly.

A second advantage is that traditional resist based lithography is not employed to define the pattern. Traditional directed self assembly employs a resist to define the initial pattern and is thus limited by all the constraints of resist based lithography. Our approach employs a resist-less imaging layer comprised of a monolayer of a surface modifying layer. This ultra thin film is used to direct the final block polymer assembly through changes in surface polarity or other surface properties. The ability to direct polymer assembly without the need of a resist step also removes the need for additional processing steps such as additional film deposition or plasma etch based transfer steps. This reduction in processing steps should act to increase chip yield due to defect reduction and reducing manufacturing cost due to reduced processing steps.

A final, and perhaps biggest advantage, is that is may not be possible to produce sub-22 nm based integrated circuits without the use of a directed self-assembly either as a stand alone technology or coupled into a grid-based dual-patterning scheme.

It is likely that potential cost advantages of this technology along with improved lithographic performance will make this technology the choice for advanced sub-22 nanometer lithography. Directed self assembly may be coupled with an advanced lithography scheme such as immersion 193-nm or EUV lithography or maskless electron beam in a dual exposure process. The dual exposure process would employ directed self assembly to form a grid pattern and then follow this with a second exposure to define the final resist pattern. This dual exposure grid based approach is heavily favored by many companies as the best route to sub-22 nanometer lithography.

It is also likely that by employing a polymer solution containing both a block polymer and a homopolymer that sub-22 nm imaging can be performed as a single lithography step. This used of this technology may be most appropriate for leading edge sub-22 nm lithography followed by full scale manufacturing at the sub-16 nm lithography and continuing on to the end the lithographic roadmap.

As the semiconductor industry approaches the limits of Moore's Law, new approaches must be undertaken to continue to shrink feature sizes into the 1-50 nm range. Self-assembly of materials into lithographically useful features may be the most effective route to achieving these feature sizes. Block polymers are one set of self-assembling materials that are currently being developed for patterning and other applications in nanofabrication. Block copolymers typically comprise two or more chemically different polymer chains connected by a covalent bond. Self assembling materials, when exposed to particular environments, tend to spontaneously form ordered structures at the molecular scale, which can have domain dimensions of about 1 nm to about 1 μm. The morphology and the size of the domains are dependent on the molecular weight and composition of the copolymer and can assume geometries such as spheres, cylinders, and lamellae.

Block copolymers have been used in demonstrations of nanofabrication because they microphase separate to form ordered, chemically distinct domains with dimensions of between 5-50 nm. The size and shape of these domains can be controlled by manipulating the molecular weight and composition of the copolymer (e.g., the molecular weight of one or more of the blocks of a block copolymer). An advantage of using block copolymer systems is that linewidth and line width roughness are dictated by thermodynamics of interaction both within the block copolymer and between the copolymer and the substrate surface.

One approach to employing block copolymers in nanofabrication is to employ resist-based lithographic techniques to define differentiated surface chemistries on a surface followed by self-assembly of the block copolymer film on the patterned surface. An example of such a technique is discussed with reference to the flow chart of Process A in FIG. 1. A resist is first coated 110 onto a hydrophobic organic material covering a hydrophilic inorganic material (e.g., a silicon wafer). The resist is then imaged 120 with energy to form a pattern thereon. Traditional resists have been patterned by a variety of advanced imaging systems employing different DUV wavelengths, EUV, X-ray, electron beams, and ion beams.

The imaged resist can then be processed 130 (e.g., developed) to provide an initial lithographic pattern. This pattern can then transferred 140 into the underlying hydrophilic inorganic substrate, e.g., by using one or more plasma etch steps. The resist is finally removed 150 to uncover the hydrophobic organic material. The resulting surface is a mixture of areas of hydrophobic organic material and hydrophilic inorganic material whose pattern has been lithographically defined by a plurality of different surface energies. The difference in surface hydrophobicity is used to direct the self assembly of block copolymers 160, which are applied to the surface. The differences in energies serve as a template to direct self assembly of the block copolymers.

For example, a thin film of a diblock copolymer can be deposited on the patterned imaging layer and annealed above the glass transition temperature of the blocks of the copolymer. During annealing, the copolymer film can self assembly into lamellar domains such that adjacent regions of the chemically patterned surface are preferentially attracted to different blocks of the copolymer. The lamellae can orient and amplify the surface pattern. After annealing, selective removal of one of the blocks can optionally be performed, resulting in a nanopatterned template that can be used in nanofabrication.

The preferential attraction is a result of several types of interactions that exist at the interface of the surface and the polymer. These intermolecular interactions as known as Lifshitz-Van der Walls interactions and can include three different interactions: London's dispersive interactions, Keeson's dipole-dipole interactions, and Debye's interactions. Additional interactions can also be present such as hydrogen bonding and Lewis acid-base interactions. A method to quantify some of these interactions is by the measurement of surface free energy of the material and polymer surfaces. The free energy can be differentiated into polar and dispersive free energies and the polar free energy can be further differentiated into acidic and basic components. It is the matching of the varies components of surface free energy between the differentiated material surfaces and the different polymer blocks that lead to directed self assembly.

The interactions between an imaged surface (e.g., the energy of the imaged surface) and the self assembling material (e.g., block copolymer) can aid in determining how the material orients on the surface. As described in the present application, many copolymers can orient as lamellar layers. However, it is understood that many other types of self-assembling orientations can be induced in the material consistent with such embodiments. Shapes such as cylinders, spheres, gyroids, and other shapes can also be assembled. In some embodiments herein, an imaged layer can tend to direct assembly of material such that the material exhibits an axis of symmetry which is substantially perpendicular to the imaged surface. Accordingly, for example, a copolymer can orient as cylinders each with an axis substantially perpendicular to the imaged surface. Lamallae can also be oriented, where the cross section of the lamellae (e.g., parallel to the imaged surface) can exhibit any number of shapes (e.g., triangular, square, rectangular, hexagonal, etc.). Examples of such orientations are discussed in Bates, F. S. et al., "Block Copolymers—Designer Soft Materials," Physics Today, February 1999, pp. 32-38, which is hereby incorporated herein by reference in its entirety.

Known approaches consistent with Process A of FIG. 1 rely on conventional lithographic patterning of the resist imaging layer, which involves multiple processing steps. As well, the resolution of the self-assembled block copolymer is often limited by the resolution imparted by the resist processing, which can be degraded relative to what can be imaged directly by the energy.

Some embodiments of the present invention are directed to processes that prepare surfaces with multiple surface energies that can be used to direct a self-assembling material to conform to a selected pattern. Such processes can eliminate the need for resist processing by allowing direct imaging of a modified surface, without requiring subsequent surface modification, deposition, or plasma etch steps. Accordingly, such processes can result in higher resolution templates that can direct assembly of materials such as block copolymers in a manner to achieve lower defect densities, and/or reduce the labor associated with preparing template surfaces.

Some exemplary embodiments are described with respect to FIG. 1, and the flow chart labeled Process B. An example is shown in FIG. 1 where an inorganic surface is modified 111 through the used of a surface agent. The modified surface, in which the surface agent can be attached to the surface, is characterized by a first surface energy. The modified surface can be imaged 121 by applying energy on the modified surface to form one or more imaged portions and one or more non-imaged portions. The imaged portions can be characterized by a second surface energy, which can be different from the first surface energy. A material capable of self assembly (e.g., a block copolymer) can be contacted with the imaged modified surface to direct assembly of the material. This step can be performed without further processing of the imaged modified surface (e.g., need for further processing the surface agent). Thus, the approach of Process B is not limited by conventional lithographic patterning of a resist imaging layer and significantly reduces manufacturing processing steps.

It should be understood that the scope of the invention is not limited to defining patterns in integrated circuit manufacturing, but techniques disclosed herein can be employed to direct the assembly of a variety of other materials including those derived from both chemical and biological origins. The advantage of multiple lithographically defined surfaces may have its greatest advantage in biological-silicon integration where the ability to differentiate three or more regions in terms of polarity, acid-base properties, hydrogen bonding, or any chemical properties would yield considerable advantages in assembly.

In conventional lithography, the resist is chemically changed by exposure to light with the degree of change proportional to the light intensity. The lithographic aerial image near the resolution limit is a sinusoidal intensity pattern and the time integrated intensity pattern is the spatial distribution of applied dose. This is shown as the sinusoidal line 210 in FIG. 2. In a convention positive resist at intensities greater than some threshold dose, the resist will change properties from being normally base insoluble to base soluble. This will result resist loss in the exposed areas and resist retention in the unexposed areas leading to pattern formation on the underlying substrate. For directed assembly, this pattern is transferred into a hydrophilic inorganic material and then the resist is removed to uncover the hydrophobic organic material leading to two distinct and different surfaces. This method gives a binary surface in terms of hydrophobicity, either hydrophobic organic or hydrophilic inorganic.

Figure 2:
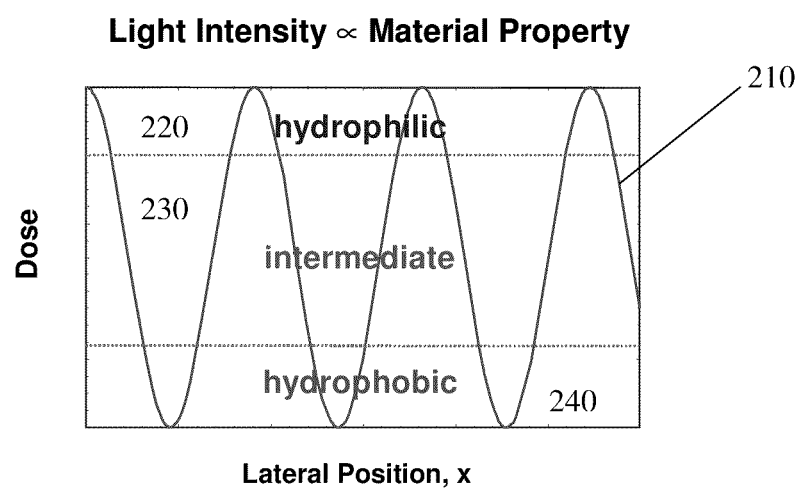
FIG. 2 is a schematic of a graph of dose against lateral position from conventional lithographic radiation, and a corresponding change in hydrophobicity of a material as a function of lithographic radiation dosage in accord with some embodiments of the present invention.

In some embodiments of the present invention, a surface is transformed directly in the lithography step with no further processing. An example is shown in FIG. 2 where the surface hydrophobicity is inversely proportional to the exposure dose. In areas of low dose 240, the normally hydrophobic surface remains hydrophobic and in areas of high dose 220 the surface is changed to hydrophilic. In areas of intermediate dose 230, the surface will exhibit an intermediate increase in its hydrophilic character. This method can yield a continuous surface in terms of hydrophobicity, in which the degree of hydrophobicity follows the aerial image intensity. This example is not meant to be limiting to changing a surface from hydrophobic to hydrophilic, as any lithographic induced change in surface properties (e.g., surface energy, surface polarity, etc.) is considered to be within the scope of the present invention.

Figure 3:
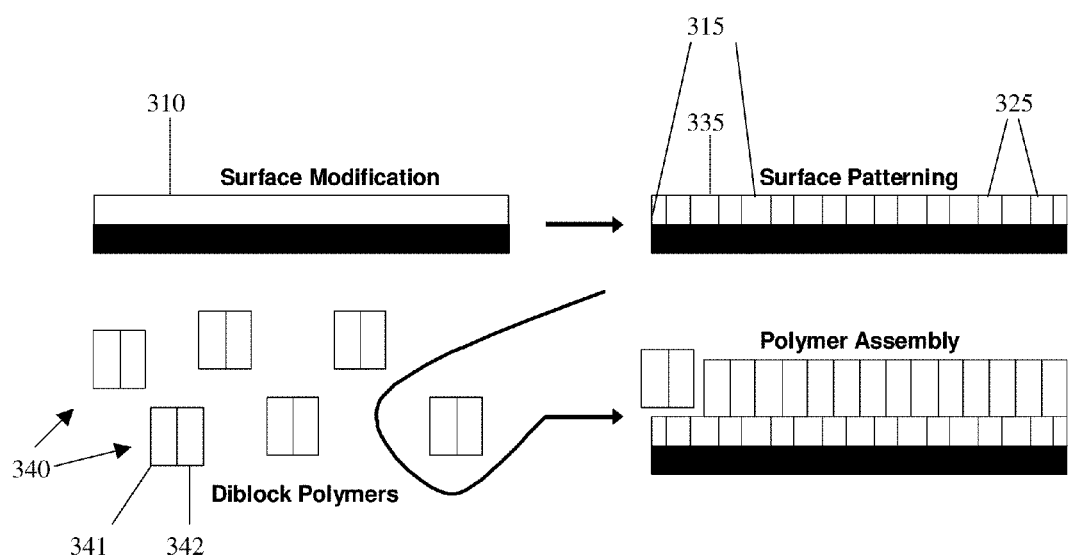
FIG. 3 is a schematic of the assembling of diblock copolymers on a densely patterned surface, in accord with some embodiments of the present invention.

A schematic diagram of surface self-assembly using a sinusoidal continuously varying surface character, consistent with a particular embodiment, is shown in FIG. 3. In this example, the initially hydrophobic surface 310 can be lithographically transformed to a surface containing regions of from hydrophobic 315, intermediate 325, and hydrophilic 335 polarity. A block polymer 340 containing both hydrophobic 342 and hydrophilic chains 341, or other appropriate self-assembling material, is introduced to the surface and directed to assemble on their like polarity surface. The hydrophobic surface 315 directs assembly of the hydrophobic chain 342 of the polymer while the hydrophilic surface 335 directs assembly of the hydrophilic chain 341 of the polymer. The surface with intermediate polarity 325 is not expected to direct assembly and is considered neutral in its directing ability. A potential advantage of continuous surface assembly is that sufficiently directing ability is present in the hydrophobic and hydrophilic regions to remove the necessary of additional processing steps to give a binary surface with distinct hydrophobic and hydrophilic regions.

As shown in FIG. 3, a selected pattern of the self-assembled material can be substantially similar to the pattern imaged on the substrate surface by different energies. Such correspondence, however, does not limit the practice of the invention. In some embodiments of the present invention there are advantages to sparse transformation of the surface in the lithography step. For instance, a surface can imaged using a pattern that repeats a selected number of times, where the pattern repetition is characterized by an imaged pitch. A subsequently self assembled material on the imaged surface can also exhibit a repeating pattern, where the assembled pattern is characterized by a assembled pitch. In a sparse transformation, the assembled pitch is smaller than the imaged pitch. Accordingly, the self assembled material can potentially exhibit smaller spatial resolution in terms of its repeated pattern relative to the imaged self assembling surface. It should be understood that the term "pitch" need not limit a repeating pattern to patterns that exhibit spatial symmetry. For example, an imaged surface energy pattern can be characterized by two alternating regions having different surface energies, where one region is larger than another. Thus, the pitch is the sum of the size of both regions. Of course, a pitch can also refer to energy regions that are identical in extent as well. Some illustrations of these differences are discussed herein.

Figure 4:
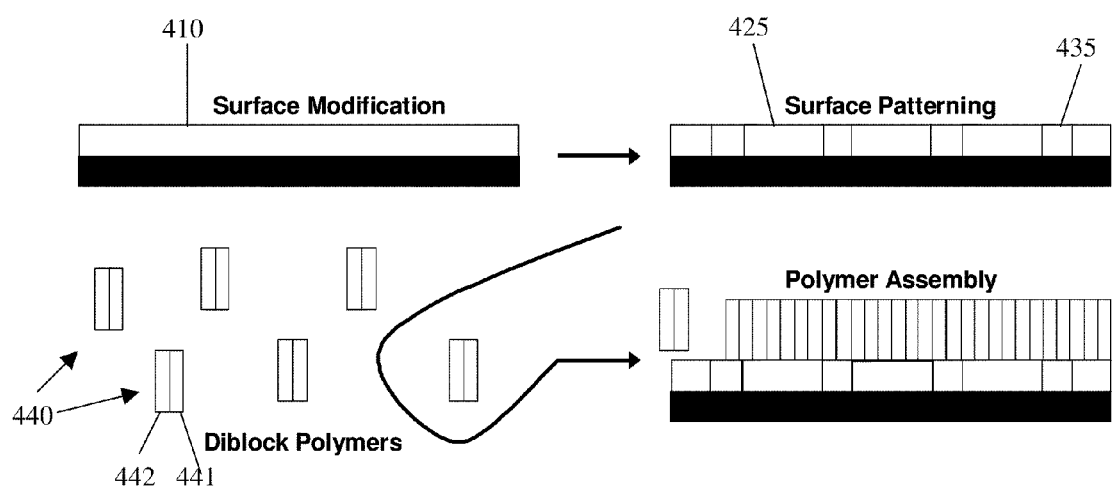
FIG. 4 is a schematic of the assembling of diblock copolymers on a sparsely patterned surface, in accord with some embodiments of the present invention.

A schematic diagram of surface self-assembly using a non-sinusoidal varying surface character, consistent with a particular embodiment, is shown in FIG. 4. In this example, the initially hydrophobic surface 410 can be lithographically transformed to a surface containing regions of from intermediate 425 and hydrophilic 435 polarity. A block polymer 440 containing both hydrophobic 441 and hydrophilic 442 chains, or other appropriate self-assembling material, is introduced to the surface and directed to assemble on their like polarity surface. The hydrophilic surface 435 directs assembly of the hydrophilic chain 442 of the polymer. The surface with intermediate polarity 425 is not expected to direct assembly and is considered neutral in its directing ability. Thus some of the hydrophilic chains of the polymer are pinned to the hydrophilic surface while other hydrophilic chains fill into the neutral surface.

A potential advantage of this embodiment is the ability to frequency multiply the amount of assembled lines relative to the amount of lithography written lines with the potential to increase the resolution of assembly by writing one line in a given pitch and assembling more them one line in that same pitch. This advantage would be especially useful when employing conventional electron beam lithography where the writing time is directly proportional to the amount of pattern being written, and/or in optical lithography when printing near the resolution limit can degrade densely written aerial imagines more then sparsely written aerial images.

Figure 5:
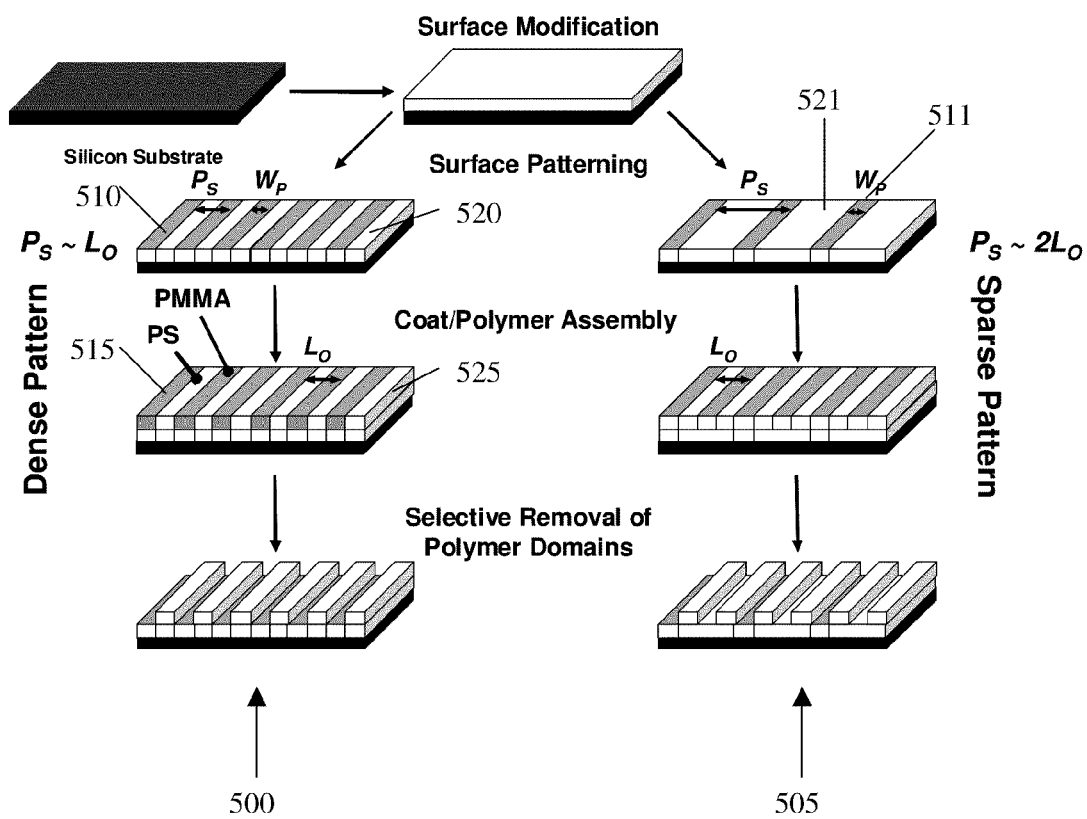
FIG. 5 is a schematic comparing the assembling of diblock copolymers on densely and sparsely patterned surfaces, in accord with some embodiments of the present invention.
Figure 6:
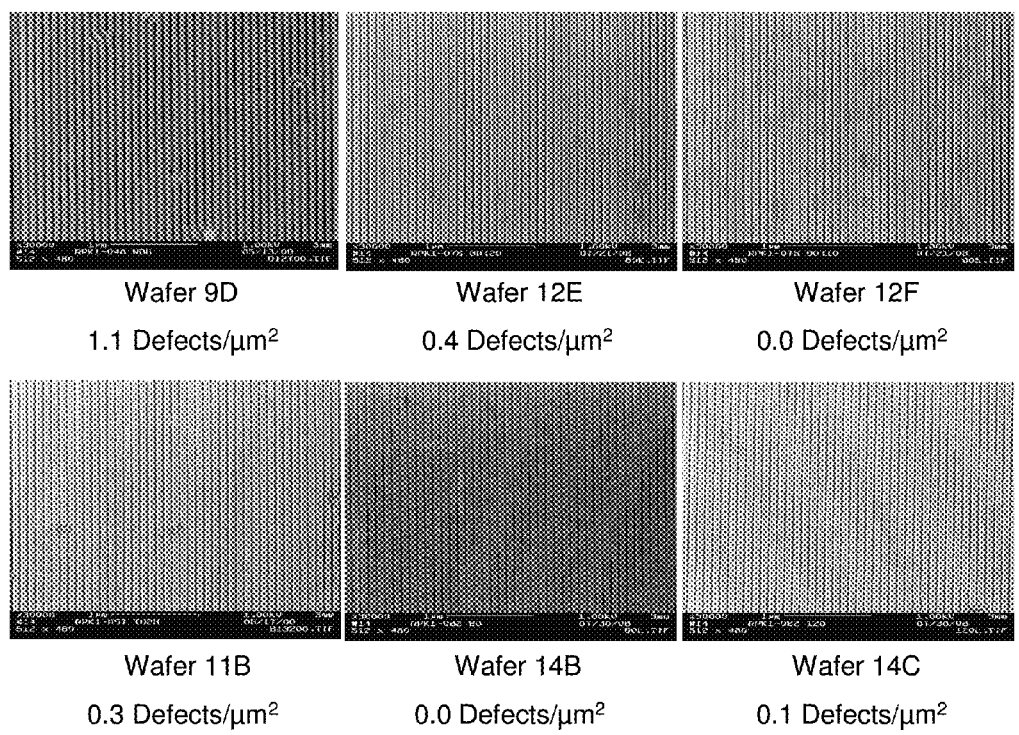
FIG. 6 presents some scanning electron microscopy ("SEM") images of poly(styrene-block-methyl methacrylate) ("P(S-b-MMA)") film on patterned "BuSiCl$_3$, the self assembling monolayer ("SAM") showing examples of classes of defects in Wafer 9D and examples of low or zero defects on the remaining SEM images, in accord with some embodiments of the present invention.

FIG. 5 shows a schematic of the directed self-assembly on dense 500 and sparse 505 chemical patterns, which can be written by e-beam lithography. In the dense patterning 500, the substrate pitch ("$P_S$") is approximately that of the lamellar spacing, $L_O$, of the block copolymer. The pinning line ("$W_P$") is the feature written that is preferential to one of the blocks and directs the self-assembly of the block copolymer film (e.g., the pinning line 510 can attract a polymethyl methacrylate block 515 with the other line 520 attracting a polystyrene block 525). In the embodiments consistent with FIG. 5, $W_p$ can exhibit a thickness of about 0.5 $L_o$. Sparse chemical patterns 505 can be generated where $P_S$ is an integral multiple of the polymer lamellar period, e.g., $P_S=nL_O$ where n is a positive integer such as two as shown for the sparse pattern 505. In between the written pinning lines 511 is a neutral surface 521 in which the block copolymer has a preferentially perpendicular orientation. Again, the pinning line 511 directs the self-assembly of the block copolymer during anneal. For example, as seen in the sparse pattern 505, a pattern with $P_S=2L_O$ and $W_P=0.5L_O$ will afford frequency doubling of the written chemical pattern after block copolymer assembly.

In some embodiments, once the material self assembles into features, one of the blocks can be removed giving a three dimensional feature similar to that obtained with conventional resist lithography. This feature can be used as a conventional resist for post lithographic processing such as masking for ion implant for doping or masking for etch or plasma etch to transfer periodic lines into the underlying substrate.

In some particular embodiments, additional surface modifications can be employed to direct self assembly of materials. An example of such a process is depicted as Process C in FIG. 1. In some embodiments, processes can employ two or more surface modification steps, and can also employ two or more resistless lithography steps (as shown in Process C), that directly change the surface energy without requiring deposition and/or plasma etch steps. In Process C, the initial surface modification 115 followed by imaging 125 gives one surface differentiated from the initial surface by any number of material surface properties. A second surface modification step 135 can then be employed to convert the exposed region to a third surface different from at least one of the first and second by type of surface energies or any number of by any number of other material surface properties. The surface modified by the second surface modification can be optionally further exposed 145 to give a third surface similar to that of the first exposed surface. The result of the double surface modification and imaging approach is that as many as three different surfaces are lithography defined on the original material surface and as such a surface more prone to directed self assembly is created. Indeed, more complicated patterns and more complicated self assembling materials (e.g., triblock copolymers) can be utilized to yield a richer space of achievable structures.

There may be advantages to performing the second surface modification step without following it by a second exposure step of Process C. This can lead to two different surface energies that are both different from the initial starting surface energy. In this case, the original surface is modified by the initial surface modifying agent and the image area is changed back to the original surface. The second surface modifying agent is then employed to modify only the image area leading to a surface containing two new surfaces different from the original and capable of improved directed self assembly.

It is understood that embodiments of the invention are not limited to two sequences of surface modification followed imaging steps. It is possible that three or more sequences of surface modification, followed optionally by imaging steps, can be employed to give multiple surfaces on a material surface capable of further improved directed self assembly. The final imaging step is still considered optional in any sequence of three or more surface modification and imaging steps.

In embodiments disclosed herein, though reference is made to use of hydrophobic surfaces on substrates, a variety of base substrates can be utilized having numerous types of surfaces can optionally be used. Non-limiting examples can include a silicon wafer or quartz wafer of a glass slide.

As well in the embodiments disclosed herein, surface agents can be embodied as surface labile moieties such a photoelectron-labile, or ion labile moiety that can be at least partially selectively removed upon exposure. As used herein, removal of at least a portion of a surface agent is meant to denote that at least a fragment of an attached surface agent is removed as a result of energy exposure. The removal of at least a portion of a surface labile moiety can cause a change in surface properties, such as surface polarity or surface energy or the acid-base properties of the surface, such that different surface states exist on the surface of the substrate. These states can be the original surface modifying material or a fragment of the surface agent material or the originally unmodified surface. The fragment of the surface agent material may be partially the original surface in the case where the energy results in removal of the surface modifying material and regenerates the original surface. The original and transformed surfaces will have sufficiently different surface polarity or other material properties such to direct the assembly of materials to the surface to where the different attractive forces of material to be assembled will be compatible with different attractive forces of the surface.

While not necessarily being bound by any particular theory, in some instances it is hypothesized that energy exposure directly results in bond breakage of in a surface agent leading to removal of at least a portion of the agent. Such removal can be distinct from mechanisms in which energy exposure leads to radical formation in which the radicals react with oxygen to form hydroperoxy radicals. While these latter mechanisms can alter surface energies, it is believed that such mechanisms can lead to surface characteristics in which self assembling molecules form structures with unacceptably high defect densities. In contrast, embodiments of the present invention can lead to self assembling structures that have substantially lower defect densities, which would enable their use in various applications requiring highly uniform structure formation.

Accordingly, some embodiments are directed to methods and materials, which involve self-assembling structures having a defect number density below a threshold value. The threshold value can be about $10/\mu m^2$, $1/\mu m^2$, $0.1/\mu m^2$, $0.01/\mu m^2$, $0.001/\mu m^2$, or lower.

Any material having suitable properties consistent with embodiments of the present invention can be utilized as a surface modifying agent. Such agents can be polymeric in nature, or non-polymeric (e.g., having a plurality of repeat units of 20 or fewer. In many embodiments, the surface modifying agent is capable of attaching to a substrate surface (or other entity) by way of a covalent bond. However, other surface agents may attach using any number of other mechanisms (e.g., ionic bonding, van der Waals forces, hydrogen bonding, etc).

In some embodiments, surface modifying agents can include silicon-containing agents, which can be silicon based coupling materials such as aryl or alkyl substituted silanols, silyl alkanols, and silyl halides. When silicon-containing agents are utilized in some embodiments as surface modifying agents, the use of energy can be such as to sever at least one bond between a silicon atom and at least one connected moiety to cause the agent to be removed. In some particular embodiments, this is distinct from situations where energy application results in conversion of a moiety connected to the silicon atom (e.g., the energy does not cause a bond between a silicon atom and another atom to break).

One aspect of the invention is to take a silicon-containing surface modifying agent as shown in Structural Formula I(a) and modify the surface of a substrate to form the bound material shown in Structural Formula I(b). In general, the surface of a substrate can be modified with any number and any degree of surface modifying agents. The surface can also be modified with more than one type of surface modifying agent by attaching the agents either sequentially or concurrently. In some aspects of this invention, it can be advantageous to modify the surface with more than one type of surface modifying agent.

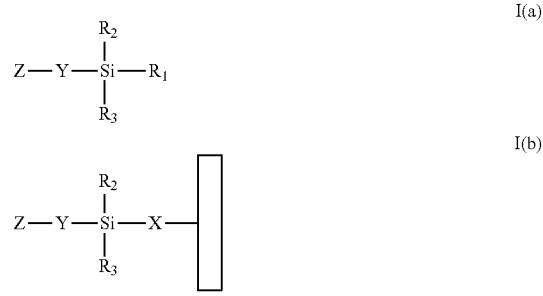

R1=F, Cl, Br, I, OH, OM, OR, R, NR$_2$, SiR$_3$, NCO, CN, OCOR
R2=F, Cl, Br, I, OH, OM, OR, R, NR$_2$, SiR$_3$, NCO, CN, OCOR
R3=F, Cl, Br, I, OH, OM, OR, R, NR$_2$, SiR$_3$, NCO, CN, OCOR
M=metal
X=NR, O
R=alkyl, cycloalkyl, vinyl, aromatic, hydrogen, haloalkyl, halovinyl, haloaromatic
Y=alkyl, cycloalkyl, vinyl, aromatic, silanes, siloxanes, haloalkyl, halovinyl, haloaromatic
Z=F, Cl, Br, I, OH, OM, OR, R, NR$_2$, SiR$_3$, NCO, CN, OCOR, NCOR, PR$_2$, PROR, P(OR)$_2$, SR, SSR, SO$_2$R, SO$_3$R.

The exemplary structure I(b) depicts the attachment between the silicon containing surface modifying agent and the surface to occur at only one point. It is well known to those skilled in the art that attachment can occur at through the displacement of R1, R2, or R3 including any combination of R1, R2, or R3, to give two or three attachment points between the silicon containing surface modifying agent and the particle. It is also well known to those skilled in the art that attachment can occur at through the displacement of the R1, R2, or R3 of one silicon containing surface modifying agent and a second silicon containing surface modifying agent previously attached to the particle. Any form of attachment of the silicon containing surface modifying agent to the particle is acceptable to the practice of this invention.

The surface modifying agents shown in Structural Formulas I(a) and I(b) contain a coupling region containing a silicon atom bonded to at least one hydrolyzable moiety, optionally a spacer region shown as Y, and an active region shown as Z. If no spacer region is employed, Z can be directly attached to the silicon. The silicon is also typically substituted with three groups designated as R1, R2, and R3 which can be identical or different provided that one group is hydrolyzable during the surface modification reaction. Hydrolyzable groups can be, but are not limited to, H, F, Cl, Br, I, OH, OM, OR, NR$_2$, SiR$_3$, NCO, and OCOR.

The spacer region Y is typically an alkyl, vinyl, aromatic silane, or siloxane-based organic moiety which can optionally be substituted with other organic moieties such as acyl halide, alcohol, aldehyde, alkane, alkene, alkyne, amide, amine, arene, heteroarene, azide, carboxylic acid, disulfide, epoxide, ester, ether, halide, ketone, nitrile, nitro, phenol, sulfide, sulfone, sulfonic acid, sulfoxide, silane, siloxane or thiol. The alkyl, vinyl, or aromatic based organic moiety may contain up to 50 carbon atoms, and contains more preferably up to 20 carbon atoms, and contains most preferably up to 10 carbon atoms. The silane or siloxane-based silicon moiety may contain up to 50 silicon or carbon atoms, and contains more preferably up to 20 silicon or carbon atoms, and contains most preferably up to 10 silicon or carbon atoms.

Attached to the Y spacer region, or optionally directly to the silicon, is the active region shown as Z. The active region can be employed to attract and bind the molecule of interest. In the case of a diblock polymer, this region will act to attract and bind the region of the polymer in which in shares a similar polarity or other form of surface attraction. The binding can be but is not limited to van der Waals interactions, hydrogen bonding, covalent bounding, and ionic bonding. The active region can also contain an alkyl, vinyl, or aromatic based organic moiety which may be substituted with other organic moieties such as acyl halide, alcohol, aldehyde, alkane, alkene, alkyne, amide, amine, arene, heteroarene, azide, carboxylic acid, disulfide, epoxide, ester, ether, halide, ketone, nitrile, nitro, phenol, sulfide, sulfone, sulfonic acid, sulfoxide, silane, siloxane or thiol. The alkyl, vinyl, or aromatic based organic moiety may contain up to 50 carbon atoms, and contains more preferably up to 20 carbon atoms, and contains most preferably up to 10 carbon atoms.

Other aspects of the invention utilize a silicon containing surface modifying agent shown in Structural Formulas II(a) and III(a) and modify the surface of a material to give the material represented in Structural Formulas II(b) and III(b), respectively. The potential identities of R1, R2, R3, X, Y, and Z are the same as delineated previously. In this aspect of the invention, the number of active regions in the surface modifying agent is more than one with each separated by spacer region. It is recognized that when more than one active region is employed on the surface modifying agent that the active regions can be attached in either a linear manner or in a branched manner from the space region. Also more than one active region can be attached to a space region, and that the spacer region can itself be branched. The number of active regions in a surface modifying agent can be any number, e.g., from 2 to 1000, with a preferred range from 2 to 100, a more preferred range from 2 to 20, and a most preferred range from 2 to 5. Accordingly, values of n in Structural Formulas II(a)(b) and III(a)(b) should be 1 or greater (e.g., corresponding with the number of active regions desired).

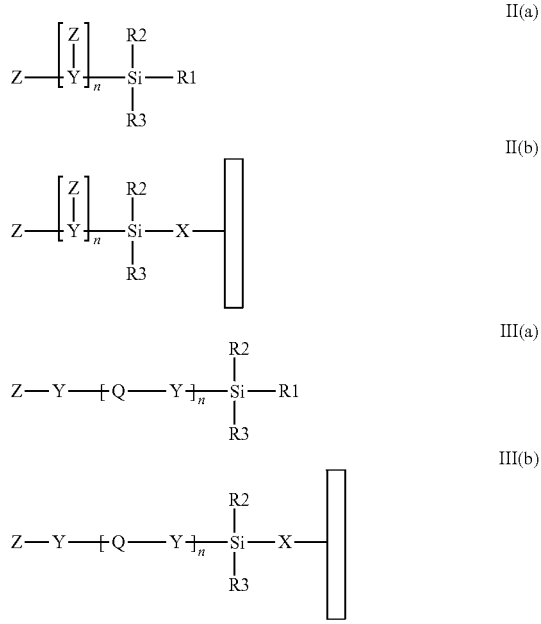

R1=F, Cl, Br, I, OH, OM, OR, R, NR$_2$, SiR$_3$, NCO, CN, OCOR
R2=F, Cl, Br, I, OH, OM, OR, R, NR$_2$, SiR$_3$, NCO, CN, OCOR
R3=F, Cl, Br, I, OH, OM, OR, R, NR$_2$, SiR$_3$, NCO, CN, OCOR
M=metal
X=NR, O
Q=O, NR, SiR$_2$, OCO, NCO, PR, POR, S, SS, SO$_2$, SO$_3$
R=alkyl, cycloalkyl, vinyl, aromatic, hydrogen, haloalkyl, halovinyl, haloaromatic
Y=alkyl, cycloalkyl, vinyl, aromatic, silanes, siloxanes, haloalkyl, halovinyl, haloaromatic
Z=F, Cl, Br, I, OH, OM, OR, R, NR$_2$, SiR$_3$, NCO, CN, OCOR, NCOR, PR$_2$, PROR, P(OR)$_2$, SR, SSR, SO$_2$R, SO$_3$R
n=an integer of value 1 or greater The active regions on a surface modifying agent can be the same or different, and the spacer regions on the surface modifying agent can be the same or different. The material can be modified with any number and with any degree of surface modifying agents. The material can also be modified with more then one type of surface modifying agent by attaching the agents either sequentially or concurrently. In some aspects of this invention, it can be advantageous to modify the material with more then one type of surface modifying agent. In other aspects of the invention, it can be advantageous to employ more then one type of surface modified material.

As discussed earlier, the surface of a substrate to which a surface agent is applied can be made of any material. In some embodiments, however, the surface of the substrate can have a surface partially composed of a metal oxide or hydroxide or halide. As such, materials containing a metal oxide surface can be utilized in this invention. Those skilled in the art will realize that any metal oxide surface can contain hydroxide functionality either innately or through a treatment to partially hydrolyze the metal oxide, and that any metal halide can also contain hydroxide functionality either innately or through a treatment to partially hydrolyze the metal halide. Organic surfaces can also be employed in this invention, e.g., when the surface has a hydroxide moiety either present or in latent form.

Alternatively, the material can be a silicon wafer that has as its surface either, silicon, the native oxide on silicon, silicon dioxide, silicon nitride, a metal oxide, a polymer, or any surface that has hydroxyl groups present or can have hydroxyl groups attached to that surface.

Surface modifying agents can be attached to the surface of a substrate by a variety of methods including those known to one skilled in the art. In one method, the substrate can be immersed directly in the neat surface modifying material. In a second method, the substrate can be immersed directly in a solution of the surface modifying material where the solvent can be any solvent that solubilizes the surface modifying material. If a solvent is employed, it is preferred that the amount of surface modifying material is less than 10% of the weight of the solution, and more preferred in the amount of surface modifying material is less than 1% of the weight of the solution, and most preferred if the amount of surface modifying material is less than 0.1% of the weight of the solution. It is preferred that the solvent employed is not reactive with the substrate or surface modifying material, although a low rate of reaction with either the substrate or surface modifying material can be acceptable. In a third method, the surface modifying material can also be spin cast either neat or in solution onto the substrate. In a fourth method, the surface modifying material can be vaporized and the vapor placed in contract with the substrate. The amount of time the surface modifying material is in contract with the substrate is non-limiting. It is preferred if the contract time is between 10 seconds and 60 minutes and the most preferred contact time is between 20 seconds and 10 minutes.

In some embodiments, multiple surface modifying agents can be employed to react with the surface. These surface modifying agents can be added either sequentially or concurrently, employing any surface attachment technique or a combination of surface attachment techniques.

Energy application on a modified surface can take place in a number of different manners, including utilizing techniques known to those skilled in the art. In many embodiments, the use of an imaging system, which can include scanning, can exclude the need for a resist or mask, though some embodiment may be practiced with either of these. The energy can be characterized by any one, or a combination of, electromagnetic radiation, ion beams, electron beams, etc. In some embodiments, the actinic radiation can include x-rays, EUV, and radiation of other wavelengths. For example, the radiation can be characterized by a wavelength greater than about 140 nm (e.g., about 157 nm), and/or a wavelength greater than about 190 nm (e.g., about 193 nm, or about 248 nm). The choice of energy can be linked with the type of surface agent utilized. For instance, it can be advantageous in some instances to utilize aryl containing agents when the energy is characterized by at least one wavelength greater than about 140 nm.

With regard to the type of self-assembling materials that can be directed by a modified surface, many embodiments utilize one or more types of block copolymers. The block polymers employed can be either A-B diblock, A-B-C triblock, or A-B-A triblock polymers. The block polymers can be employed either individually or as mixtures with other diblock or triblock polymers. The block polymers can also be employed as mixtures with other homopolymers or copolymers and one of the preferred methods would be to employ a block copolymer as a mixture with a homopolymer in which the homopolymer is made from the same monomer as one of the blocks of the block polymer. A second preferred method would be to employ mixtures of two block copolymers in which the diblock copolymers were made from the same two monomers, but that the blocks differed in molecular weight. Molecular weights of the blocks can vary from 1,000 Daltons to 10,000,000 Daltons. For lithographic assembly the preferred molecular weights will be between 2,000 Daltons to 500,000 Daltons, with a more preferred range of molecular weights between 5,000 Daltons to 130,000 Daltons.

Any polymer capable of being prepared as a diblock or triblock polymer can be employed in this invention as a material capable of self assembly. One class of monomers that would be particularly useful as one component of the diblock or triblock polymer are acrylate and methacrylate based monomers. Non-limiting examples of these monomers are acrylic acid, sodium acrylate, methacrylic acid, sodium methacrylate, propylacrylic acid, methyl methacrylate, ethyl methacrylate, n-propyl methacrylate, n-butyl acrylate, n-butyl methacrylate, iso-butyl methacrylate, s-butyl methacrylate, t-butyl acrylate, t-butyl methacrylate, cyclohexyl methacrylate, 2-ethyl hexyl acrylate, neopentyl acrylate, n-octyl acrylate, n-nonyl acrylate, lauryl methacrylate, trifluoroethyl methacrylate, 2-hydroxylethyl acrylate, 2-hydroxylethyl methacrylate, 2-hydroxypropyl methacrylate, 2-pyranoxy ethyl methacrylate, 1-ethoxy ethyl methacrylate, tetrahydrofurfuryl methacrylate, N,N-dimethyl amino ethyl methacrylate, bipyridylmethyl acrylate, acrylamide, N,N-dimethyl acrylamide, N-isopropyl acrylamide, N,N-dimethylaminoethylmethacrylate, and acrylonitrile.

A second class of monomers that would be particularly useful as one component of the diblock or triblock polymer are ethylenic based monomers. Non-limiting examples of these monomers are ethylene, butadiene(1.2 addition), butadiene(1.4 addition), isobutylene, and isoprene. A third class of monomers that would be particularly useful as one component of the diblock or triblock polymer are styrenic based monomers. Non-limiting examples of these monomers are styrene, α-methylstyrene, t-butyl styrene, t-butoxystyrene, 4-hydroxyl styrene, 4-methyoxy styrene, 4-aminomethyl styrene, p-chloromethyl styrene, 4-styrenesulfonic acid, 2-vinyl naphthalene, 2-vinylpyridine, 4-vinylpyridine, N-methyl 2-vinyl pyridinium iodide, and N-methyl 4-vinyl pyridinium iodide. A fourth class of monomers that would be particularly useful as one component of the diblock or triblock polymer are siloxane based monomers. Non-limiting examples of these monomers are dimethylsiloxane, diphenyl siloxane, and methyl phenyl siloxane. It is also possible that copolymers can be employed as part of a single block as long as the two co-monomers are of similar polarity to each other and a different polarity to that of the other block of the block polymer.

Experiments conducted and discussed herein direct the self assembly of diblock copolymers. It is expected that the scope of this invention is not limited to block copolymers, but can be employed to lithographically direct any self assembling material onto a surface. The self assembling material may have regions of differing polarity or some other differentiating molecular characteristic. The material does not have to have different regions but only be different in some aspect from that of some regions of the surface. An example would be the placement of a material preferentially on some lithographically defined area of a surface in preference to a separately defining area of a surface.

Examples of self assembling materials include a molecule, polymer, protein, organelle, or biological organism. The material can optionally have two or more regions that are different in terms of polarity, acid-base properties, hydrogen bonding, or any chemical properties that would affect attraction or repulsion between one lithographically defined surface and another.

EXAMPLES

The following examples are provided to illustrate some embodiments of the invention. The examples are not intended to limit the scope of any particular embodiment(s) utilized.

Experimental Description

Materials

Methyltrichlorosilane, n-butyltrichlorosilane, phenyltrichlorosilane, 4-methylphenyltrichlorosilane, phenethyltrichlorosilane, 4-t-butylphenethyltrichlorosilane, 3,3,3-trifluoropropylsilane, and 1H,1H,2H,2H-tridecafluorooctyltrichlorsilane were purchased from Gelest and used as received. Toluene was purchased from VWR and used without further purification. Symmetric poly(styrene-block-methyl methacrylate) ("P(S-b-MMA)") block copolymers were purchased from Polymer Source Inc. Three molecular weights of P(S-b-MMA) were used: Polymer A has a number-average molar mass of 211 000 g/mol, a polydispersity of 1.13, a styrene volume fraction of 0.54, and $L_O$ of about 86 nm; Polymer B has a number-average molecular weight of 263 000 g/mol, a polydispersity of 1.1, styrene volume fraction of 0.54, and $L_o$ of about 95 nm; Polymer C has a number-average molecular weight of 98 200 g/mol, a polydispersity of 1.13, styrene volume fraction of 0.56, and $L_O$ of about 45 nm. CD26 is a commercial 2.38% TMAH based aqueous based resist developer from Rohm and Haas.

General Exposure Conditions

Bulk exposure was performed at either 157-nm with a laboratory-class projection system employing an $F_2$ laser or at 193-nm with a laboratory-class projection system employing an ArF laser. The surface modified silicon wafer was placed on a vacuum chuck of an x-y stepper directly in front of an 8-mm aperture of laser system. A 6×6 dose matrix was programmed into the computer controller and each spot received an increasing energy dose until the desired final total dose was reached. Once exposed, the wafer was rinsed with deionized water and blown dry with a stream of nitrogen.

Interference exposure was performed at 157-nm with a laboratory built two-beam 157-nm interference system based on a Jamin interferometer. This system is capable of forming periodic lines and spaces with a 91-nm pitch. The surface modified silicon wafer were exposed to a 4×3 exposure dose matrix, then rinsed with deionized water and dried under a stream of nitrogen before diblock copolymer deposition.

The EUV lithography exposures were performed at the Lawrence Berkeley National Laboratory on a 0.30 NA microfield exposure tool. The surface modified silicon wafer were exposed to a 9×11 focus-exposure dose matrix, then rinsed with deionized water and dried under a stream of nitrogen before diblock copolymer deposition.

Electron-beam patterning was performed on a JBX6000FS electron beam exposure system at 50 kV accelerating voltage. After electron beam patterning the wafer was exposed to UV-ozone using a Novascan PSD-UV3 Digital UV Ozone System.

General Surface Energy Measurement Conditions

Contact angle measurements were performed using deionized water and decalin. In a typical measurement, a 1 µL drop of water was placed on the surface of the film being measured using a microsyringe. On a microscope stage equipped with a Boeckler Instruments Microcode II measurement device, the x- and y-diameters were measured and averaged according to $d=(x^2+y^2)^{1/2}$. This diameter value can be converted to a contact angle according to Bikerman's equation given in equation 1 where d is the diameter of the drop and V is the volume of the drop. After the water and decalin contact angles were determined, the polar and dispersive surface energies for a given surface were calculated by the method of Fowkes.

$$d^3/V = 24 \sin^3\theta/\pi(2-3\cos\theta+\cos^3\theta) \quad \text{Equation 1}$$

General Deposition Process Conditions

Thin films of P(S-b-MMA) were deposited onto patterned surface modified substrates by spin coating from dilute solutions (0.5-2% w/w) of the copolymers in toluene. In some cases, blends of two different molecular weights of copolymer were used. Films were spun at rates from 1500 to 3500 rpm for 60 seconds and then baked at 130° C. on a hot plate for 60 seconds to drive off residual solvent. The initial thicknesses of the films were determined using a Gaertner Scientific Corporation L115BLC Dual Wavelength Ellipsometer using a He—Ne laser ($\lambda$=632.8 nm) at an incident angle of 70° relative to the surface normal of the substrates. The polymer films were annealed at various temperatures, times and locations, depending on the experimental conditions. After annealing, the films were investigated using scanning electron microscopy (SEM) and atomic force microscopy (AFM).

Example 1

Polar and Dispersive Surface Energies of Surface Modified Substrate

Silicon wafers were cleaned by immersion in CD26 for 10 minutes, rinsed with deionized water and blown dry under a stream of nitrogen. Cleaned wafers were immediately placed into a 10% (v/v) solution of $RSiCl_3$ in toluene for 10 minutes to modify the silicon surface. Wafers were then rinsed with toluene and blown dry under a stream of nitrogen. The polar and dispersive surface energies of the modified silicon surface are summarized in Table 1.

TABLE 1

Polar and dispersive surface energies of modified surfaces from $RSiCl_3$.

| $RSiCl_3$ | Polar Surface Energy (dynes/cm) | Dispersive Surface Energy (dynes/cm) |
|---|---|---|
| Me— | 0.01 | 31.4 |
| $^n$Bu— | 0.6 | 28.7 |
| Ph— | 2.8 | 31.3 |
| $CH_3$—Ph— | 3.8 | 31.2 |
| $PhCH_2CH_2$— | 4.3 | 31.2 |
| t-Bu$PhCH_2CH_2$— | 0.6 | 31.5 |
| $CF_3CH_2CH_2$— | 4.8 | 23.3 |
| $CF_3(CF_2)_5CH_2CH_2$— | 1.0 | 12.6 |

The example shows the polar and dispersive surface energies that occurred from various alkyl, aromatic, and fluorinated surface modifying agents prepared from toluene solutions of $RSiCl_3$. All of the modified surfaces have relatively low polar surface energies. The fluorinated surface modifying agents have much lower dispersive surface energies than do the alkyl/aromatic ones.

Example 2

Comparison of $RSiCl_3$ Concentrations Used for Surface Modification

Silicon wafers were cleaned by immersion in CD26 for 10 minutes, rinsed with deionized water and blown dry under a stream of nitrogen. Cleaned wafers were immediately immersed in a 0.01 to 10% (v/v) solution of $^n$BuSiCl$_3$ in toluene. After 10 minutes, the wafers were then rinsed with toluene and blown dry under a stream of nitrogen. Surface energies were measured as above. The data are summarized in Table 2.

TABLE 2

Surface energies of $^n$BuSiCl$_3$ modified surfaces prepared with various concentrations of $^n$BuSiCl$_3$ in toluene.

| % $^n$BuSiCl$_3$ | Polar Surface Energy (dynes/cm) | Dispersive Surface Energy (dynes/cm) |
|---|---|---|
| 0.01 | 0.8 | 27.1 |
| 0.1 | 0.8 | 27.5 |
| 1.0 | 0.5 | 28.2 |
| 10 | 0.6 | 27.1 |

The example shows that, for a 10 minute immersion time, there is very little difference in polar and dispersive surface energy of "BuSiCl$_3$ modified surfaces prepared with concentrations in the range of 0.01 to 10% (v/v).

Example 3

Surface Energies after 157-nm Exposure

Wafers coated with the surface modifying agents in Example 1 were exposed to a series of different exposure doses at 157 nm in the manner listed in General Exposure Conditions. Surface energies of each spot were measured as above. The data for representative points are summarized in Tables 3 and 4.

TABLE 3

Polar surface energy (dynes/cm).

| RSiCl$_3$ | Dose (mJ/cm$^2$) | | | | |
|---|---|---|---|---|---|
| | 0 | 49 | 100 | 204 | 415 |
| Me— | 0.0 | 6.0 | 22.8 | 38.1 | 42.7 |
| "Bu— | 0.6 | 36.4 | 41.5 | 41.8 | 42.5 |
| Ph— | 2.8 | 10.1 | 19.2 | 21.4 | 41.4 |
| PhCH$_2$CH$_2$— | 4.3 | 15.4 | 32.9 | 32.5 | 42.6 |
| CF$_3$CH$_2$CH$_2$— | 4.8 | 5.2 | 6.9 | 9.9 | 32.7 |
| CF$_3$(CF$_2$)$_5$CH$_2$CH$_2$— | 1.0 | 2.2 | 2.3 | 2.2 | 21.3 |

TABLE 4

Dispersive surface energy (dynes/cm).

| RSiCl$_3$ | Dose (mJ/cm$^2$) | | | | |
|---|---|---|---|---|---|
| | 0 | 49 | 100 | 204 | 415 |
| Me— | 31.4 | 31.2 | 31.1 | 31.0 | 31.0 |
| "Bu— | 28.7 | 30.2 | 30.6 | 30.7 | 30.7 |
| Ph— | 31.3 | 31.2 | 31.1 | 31.1 | 31.0 |
| PhCH$_2$CH$_2$— | 31.2 | 31.1 | 31.0 | 31.0 | 31.0 |
| CF$_3$CH$_2$CH$_2$— | 23.3 | 23.9 | 26.4 | 29.8 | 30.8 |
| CF$_3$(CF$_2$)$_5$CH$_2$CH$_2$— | 12.6 | 12.6 | 13.6 | 22.0 | 24.6 |

The example shows that exposure of the modified surface to 157-nm irradiation will change the surface energies in an amount corresponding to exposure dose. All of the alkyl/aromatic modified surfaces show a rapid increase in polar surface energy, but relatively little change in dispersive surface energy, with moderate increases in exposure dose, with a polar surface energy plateau of around 42 dynes/cm, the value for untreated SiO$_2$. The fluorinated modified surfaces show little change in their polar surface energies until much higher (>200 mJ/cm$^2$) doses. However, these materials start out with much lower dispersive surface energies than their alkyl counterparts. These values also change with increasing exposure dose.

Example 4

Surface Energies After 193-nm Exposure

Wafers coated with the surface modifying agents in Example 1 were exposed to a series of different exposure doses at 193 nm in the manner listed in General Exposure Conditions. Surface energies of each spot were measured as above. The data for representative points are summarized in Tables 5 and 6.

TABLE 5

Polar surface energy (dynes/cm).

| RSiCl$_3$ | Dose (mJ/cm$^2$) | | | | |
|---|---|---|---|---|---|
| | 0 | 20 | 59 | 171 | 415 |
| Me— | 0.01 | 0.08 | 0.42 | 1.34 | 0.69 |
| Ph— | 2.8 | 3.77 | 5.41 | 6.64 | 15.41 |
| PhCH$_2$CH$_2$— | 4.3 | 3.77 | 4.83 | 7.97 | 16.18 |

TABLE 6

Dispersive surface energy (dynes/cm).

| RSiCl$_3$ | Dose (mJ/cm$^2$) | | | | |
|---|---|---|---|---|---|
| | 0 | 20 | 59 | 171 | 415 |
| Me— | 31.4 | 27.09 | 27.07 | 27.04 | 28.21 |
| Ph— | 31.3 | 31.25 | 31.23 | 31.21 | 31.13 |
| PhCH$_2$CH$_2$— | 31.2 | 31.25 | 31.24 | 31.20 | 31.12 |

The example shows the exposure of films of aromatic-based surface modifying agents will change the polar surface energies based on exposure dose. The methyl-based surface modifying agents is not absorbing at 193 nm, and thus does not appreciably change polar surface energy upon exposure. All of the surface modifying agents do not appreciably change their dispersive surface energy throughout the exposure dose matrix.

Example 5

Surface Energies of Diblock Copolymer Components

A silicon wafer was vapor primed for 1 minute with hexamethyldisilazide (HMDS). A polymer film of 200 nm was spun from a dilute toluene solution and dried on a hot plate for 1 minute at 130° C. The surface energies of the polymer films were measured as above. The data are summarized in Table 7.

TABLE 7

Polar and dispersive surface energies of various polymer films.

| Polymer | Polar Surface Energy (dynes/cm) | Dispersive Surface Energy (dynes/cm) |
|---|---|---|
| Poly(styrene) | 0.4 | 31.3 |
| Poly(methyl methacrylate) | 7.4 | 31.0 |
| Poly(styrene-co-methyl methacrylate) (40:60) | 6.0 | 31.2 |

The example shows the surface energies of the two components of the diblock copolymers under investigation. These measurements also confirm that there is sufficient polar surface energy difference in order to direct their assembly on a patterned surface. In a random blend of the two components, the surface energy is closer to polymethyl metharylate then polystyrene.

Example 6

Surface Energies Employing Multiple Surface Modifying Steps

Three silicon wafers were cleaned by immersion in CD26 for 10 minutes, rinsed with deionized water and blown dry under a stream of nitrogen. Cleaned wafers were immediately placed into a 10% (v/v) solution of $^n$BuSiCl$_3$ in toluene for 10 minutes to modify the silicon surface. Wafers were then rinsed with toluene and blown dry under a stream of nitrogen.

All three wafers (A-C) modified with $^n$BuSiCl$_3$ were exposed to a 157-nm with a series of different exposure doses as described in General Exposure Conditions. Wafer A was set aside for surface energy measurements. Wafers B and C were then re-immersed to a solution of $^n$BuSiCl$_3$ in toluene for 10 minutes as described in the first step and Wafer B was set aside for surface energy measurements. Wafer C was re-exposed at 157-nm with a second series of different exposure doses as described in General Exposure Conditions and the surface energies measured. The data for each wafer is summarized in Table 8.

TABLE 8

| | Polar and dispersive surface energies (dynes/cm). | | | | | |
|---|---|---|---|---|---|---|
| Dose | Wafer A | | Wafer B | | Wafer C | |
| (mJ/cm$^2$) | Polar | Dispersive | Polar | Dispersive | Polar | Dispersive |
| 36 | 2.59 | 30.25 | 0.75 | 29.68 | 5.18 | 29.92 |
| 62 | 4.47 | 30.49 | 0.76 | 29.56 | 8.24 | 30.39 |
| 96 | 14.67 | 31.07 | 0.36 | 29.82 | 17.96 | 30.61 |
| 200 | 31.30 | 30.96 | 0.16 | 29.06 | 33.86 | 30.70 |

Wafer A shows a typical surface energy changes for $^n$BuSiCl$_3$ modified surfaces exposed with 157-nm. Re-immersion of an exposed wafer into a toluene solution of $^n$BuSiCl$_3$ to give Wafer B essentially resets the polar surface energy at each initial dose as if no exposure induced change occurred. No change is observed in dispersive surface energy. Exposure of the re-modified wafer at 157-nm to a second series of different exposure doses results in a near duplication of surface energies observed with Wafer A. These results show that the RSiCl$_3$ can be used repeatedly modify a surface and be removed by 157-nm irradiation.

Example 7

Surface Energies Employing Multiple Surface Modifying and Imaging Steps

Four silicon wafers (D-G) were cleaned by immersion in CD26 for 10 minutes, rinsed with deionized water and blown dry under a stream of nitrogen. Cleaned wafers D-F were immediately placed into a 10% (v/v) solution of $^n$BuSiCl$_3$ in toluene for 10 minutes. Wafers were then rinsed with toluene and blown dry under a stream of nitrogen. Wafer G was immersed in a 10% (v/v) solution of CF$_3$CH$_2$CH$_2$SiCl$_3$ in toluene for 10 minutes. The wafer was then rinsed with toluene and blown dry under a stream of nitrogen. Wafers (D-G) modified with $^n$BuSiCl$_3$ were exposed at 157-nm to a series of different exposure doses as described in General Exposure Conditions. Wafer D was set aside for surface energy measurements. Wafers E and F were then re-immersed in a solution of CF$_3$CH$_2$CH$_2$SiCl$_3$ in toluene for 10 minutes as described in the first step and Wafer E was set aside for surface energy measurements. Wafer F was re-exposed to a second series of 157-nm of different exposure doses as described in General Exposure Conditions and the surface energies measured. Control Wafer G was exposed at 157-nm to a series of different exposure doses as described in the General Exposure Conditions. The data for each wafer is summarized in Table 9.

TABLE 9

| | Polar and dispersive surface energies (dynes/cm). | | | | | | | |
|---|---|---|---|---|---|---|---|---|
| Dose | Wafer D | | Wafer E | | Wafer F | | Wafer G | |
| (mJ/cm$^2$) | Polar | Dispersive | Polar | Dispersive | Polar | Dispersive | Polar | Dispersive |
| 10 | 1.83 | 28.05 | 0.58 | 25.26 | 0.65 | 22.74 | 5.63 | 20.55 |
| 52 | 14.97 | 30.41 | 4.91 | 20.93 | 9.25 | 21.96 | 9.40 | 21.61 |
| 96 | 29.53 | 30.77 | 6.27 | 20.54 | 11.15 | 21.24 | 11.15 | 21.24 |
| 200 | 41.09 | 30.89 | 5.03 | 20.55 | 9.11 | 22.30 | 12.99 | 22.59 |

The example shows the effect of partial removal of one surface modifying agent and the introduction of a second surface modifying agent. Wafer D shows a typical surface energy changes for $^n$BuSiCl$_3$ modified surfaces exposed with 157-nm. Wafer E shows that at low 157-nm exposure doses the surface energy is similar to that of Wafer D as little of the initial surface modifying agent is removed and replaced by the second surface modifying agent. At higher exposure doses the surface energy is similar to that of a surface treated with CF$_3$CH$_2$CH$_2$SiCl$_3$ as much of the initial surface modifying agent is removed and replaced by the second surface modifying agent.

Wafer F shows that at low 157-nm exposure doses the surface energy is similar to that of Wafer D as little of the initial surface modifying agent is removed and replaced by the second surface modifying agent. At higher exposure doses the surface energy is similar to that of Wafer G where the second surface modifying agent that initial replaced the first surface modifying agent is now partially removed. Wafer G shows the surface energy of surfaces that have treated only with the F$_3$CH$_2$CH$_2$SiCl$_3$ surface modifying agents and then exposed. This experiment shows that the surface energy can changed be by employing two surface modifying agents and either one or two exposures.

Example 8

Sequential Self Assembling Monolayer ("SAM") Deposition and Exposure Using a Second SAM After Complete Removal of the First SAM Two silicon wafers (H-I) were cleaned by immersion in CD26 for 10 minutes, rinsed with deionized water and blown dry under a stream of nitrogen. Wafer H was immediately placed into a 10% (v/v) solution of $^n$BuSiCl$_3$ in toluene for 10 minutes. The wafer was then rinsed with toluene and blown dry under a stream of nitrogen. Control Wafer I was immersed in a 10% (v/v) solution of CF$_3$CH$_2$CH$_2$SiCl$_3$ in toluene for 10 minutes. The wafer was then rinsed with toluene and blown dry under a stream of nitrogen. Wafer H was exposed to a 6×6 matrix of 200 mJ/cm$^2$ using a 157-nm laser as described as described in General Exposure Conditions. Wafer H was then re-immersed in a solution of $CF_3CH_2CH_2SiCl_3$ in toluene for 10 minutes and then the wafer was rinsed with toluene and blown dry under a stream of nitrogen. Both wafers were exposed at 157-nm to a series of different exposure doses as described in General Exposure Conditions and the surface energies measured. The data are summarized in Table 10.

TABLE 10

Polar and dispersive surface energies (dynes/cm).

| Dose | Wafer H | | Wafer I | |
|---|---|---|---|---|
| (mJ/cm$^2$) | Polar | Dispersive | Polar | Dispersive |
| 49 | 5.90 | 19.76 | 6.13 | 20.92 |
| 100 | 11.98 | 21.23 | 9.11 | 22.61 |
| 204 | 13.84 | 22.59 | 12.62 | 25.10 |
| 415 | 25.46 | 25.47 | 43.28 | 28.59 |

The example shows that the complete removal of the "BuSiCl$_3$ surface modifying agent using high exposure doses at 157 nm effectively resets the SiO$_2$ surface. A second surface modifying agent can be applied and the resulting change in surface energy with exposure is similar to that from a surface that was only modified by the second surface modifying agent. At all exposure doses, Wafer H, which underwent multiple processing steps, behaves in a similar fashion to the Wafer I in terms of polar and dispersive surface energy measurements.

Example 9

Directed Self-Assembly of PS-b-PMMA by Vacuum Annealing on a Patterned Surface

A silicon wafer was cleaned by immersion in CD26 for 10 minutes, rinsed with deionized water and blown dry under a stream of nitrogen. The cleaned wafer was immediately placed into a 10% (v/v) solution of "BuSiCl$_3$ in toluene for 10 minutes for the SAM film on the silicon surface. The wafer was then rinsed with toluene and blown dry under a stream of nitrogen. The surface modified wafer was patterned with the 157-nm interference laser system as described above.

Polymer films were spun from a 2% (w/w) solution of a Polymer A in toluene at 2600 rpm for 60 seconds, and then baked for 60 seconds at 130° C. on a hot plate. The polymer film thickness was determined to be 93 nm. The polymer film was annealed at 240° C. in a vacuum oven for 16 hours. After annealing, it was found that exposing wafer number 9 with an exposure dose of 37-47 mJ/cm$^2$ with the 157-nm interference laser provided enough surface energy differentiation to drive the block copolymer film alignment.

Example 10

Directed Self-Assembly of P(S-b-MMA) by Hot Plate Annealing on Patterned Surface A silicon wafer was cleaned by immersion in CD26 for 10 minutes, rinsed with deionized water and blown dry under a stream of nitrogen. The cleaned wafer was immediately placed into a 10% (v/v) solution of "BuSiCl$_3$ in toluene for 10 minutes. The wafer was then rinsed with toluene and blown dry under a stream of nitrogen. The surface modified wafer was patterned with the 157-nm interference laser system as described above.

Polymer films were spun from a 0.9% (w/w) solution of Polymer A in toluene at 2600 rpm for 60 seconds, and then baked for 60 seconds at 130° C. on a hot plate as described above. The polymer film thickness was determined to be 46 nm. The polymer film was annealed at 240° C. on a hot plate in a nitrogen-filled glove box for either 1 or 2 hours. The 157-nm interference exposure doses that resulted in aligned polymer films after annealing for each blend can be found in Table 11.

TABLE 11

Hot plate annealing times of Polymer A and exposure doses which show aligned block copolymer films.

| Wafer Number | Hot Plate Annealing Time (h) | Aligned Exposure Doses (mJ/cm$^2$) |
|---|---|---|
| 10A | 1.0 | 39-47 |
| 10B | 2.0 | 33-55 |

Example 11

Directed Self-Assembly of P(S-b-MMA) by Hot Plate Annealing on Patterned Surface A silicon wafer was cleaned by immersion in CD26 for 10 minutes, rinsed with deionized water and blown dry under a stream of nitrogen. The cleaned wafer was immediately placed into a 10% (v/v) solution of "BuSiCl$_3$ in toluene for 10 minutes. The wafer was then rinsed with toluene and blown dry under a stream of nitrogen. The surface modified wafer was stored for 4 days at room temperature in air and then patterned with the 157-nm interference laser system as described above.

Polymer films were spun from a 0.9% (w/w) solution of Polymer A in toluene at 2600 rpm for 60 seconds, and then baked for 60 seconds at 130° C. on a hot plate as described above. The polymer film thickness was determined to be 46 nm. The polymer film was annealed at 240° C. on a hot plate in a nitrogen-filled glove box for either 1 or 2 hours. The 157-nm interference exposure doses that resulted in aligned polymer films after annealing for each blend can be found in Table 12.

TABLE 12

Hot plate annealing times of Polymer A and exposure doses which show aligned block copolymer films.

| Wafer Number | Hot Plate Annealing Time (h) | Aligned Exposure Doses (mJ/cm$^2$) |
|---|---|---|
| 11A | 1.0 | 35-49 |
| 11B | 2.0 | 39-55 |

Example 12

Directed Self-Assembly of P(S-b-MMA) Blends by Hot Plate Annealing on Patterned Surface Four silicon wafers were cleaned by immersion in CD26 for 10 minutes, rinsed with deionized water and blown dry under a stream of nitrogen. The cleaned wafers were immediately placed into a 10% (v/v) solution of "BuSiCl$_3$ in toluene for 10 minutes. The wafers were then rinsed with toluene and blown dry under a stream of nitrogen. The surface modified wafers were patterned with the 157-nm interference laser system as described above.

Polymer films were spun from a 0.9% (w/w) solution of blended Polymer A/Polymer B block copolymer in toluene at 2600 rpm for 60 seconds, and then baked for 60 seconds at 130° C. on a hot plate as described above. The polymer film thickness was determined to be 46 nm. The polymer films were annealed at 240° C. on a hot plate in a nitrogen-filled glove box for 2 hours. The 157-nm interference exposure doses that resulted in aligned polymer films after annealing for each blend can be found in Table 13.

TABLE 13

Fractions of Polymer A:Polymer B and exposure doses which show aligned block copolymer films.

| Wafer Number | Polymer A | Polymer B | Aligned Exposure Doses (mJ/cm$^2$) |
|---|---|---|---|
| 12A | 40 | 60 | 41-49 |
| 12B | 50 | 50 | 47-55 |
| 12C | 60 | 40 | 47-55 |
| 12D | 70 | 30 | 41-55 |
| 12E | 80 | 20 | 41-61 |
| 12F | 90 | 10 | 39-61 |

Example 13

Directed Self-Assembly of a 70:30 Polymer A:Polymer B P(S-b-MMA) Blend by Hot Plate Annealing on Patterned SAM Formed from Different RSiCl$_3$ Concentrations in Toluene Three silicon wafers were cleaned by immersion in CD26 for 10 minutes, rinsed with deionized water and blown dry under a stream of nitrogen. The cleaned wafers were immediately placed into a solution of $^n$BuSiCl$_3$ of various concentrations in toluene for 10 minutes. The wafers were then rinsed with toluene and blown dry under a stream of nitrogen. The surface modified wafers were patterned with the 157-nm interference laser system as described above.

Polymer films were spun from a 0.9% (w/w) solution of a 70:30 blend block copolymers A:B in toluene at 2600 rpm for 60 seconds, and then baked for 60 seconds at 130° C. on a hot plate as described above. The polymer film thickness was determined to be 46 nm. The polymer film was annealed at 240° C. on a hot plate in a nitrogen-filled glove box for 2 hours. The 157-nm interference exposure doses that resulted in aligned polymer films after annealing for each blend can be found in Table 14.

TABLE 14

BuSiCl$_3$ SAM preparation concentrations and exposure doses which show aligned block copolymer films.

| Wafer Number | $^n$BuSiCl$_3$ Concentration (% v/v) | Aligned Exposure Doses (mJ/cm$^2$) |
|---|---|---|
| 13A | 0.1 | 47-53 |
| 13B | 1.0 | 43-51 |
| 13C | 10 | 43-55 |

Example 14

Directed Self-Assembly of a 90:10 Polymer A:Polymer B P(S-b-MMA) Blend by Hot Plate Annealing on Patterned SAM at Different Hot Plate Times Three silicon wafers were cleaned by immersion in CD26 for 10 minutes, rinsed with deionized water and blown dry under a stream of nitrogen. The cleaned wafers were immediately placed into a 10% (v/v) solution of $^n$BuSiCl$_3$ in toluene for 10 minutes. The wafers were then rinsed with toluene and blown dry under a stream of nitrogen. The surface modified wafers were patterned with the 157-nm interference laser system as described above.

Polymer films were spun from a 0.9% (w/w) solution of a 90:10 blend block copolymers A:B in toluene at 2600 rpm for 60 seconds, and then baked for 60 seconds at 130° C. on a hot plate as described above. The polymer film thickness was determined to be 46 nm. The polymer film was annealed at 260° C. on a hot plate in a nitrogen-filled glove box for 0.5, 1 or 2 hours. The 157-nm interference exposure doses that resulted in aligned polymer films after annealing for each blend can be found in Table 15.

TABLE 15

Hot plate annealing times and exposure doses which show aligned block copolymer films.

| Wafer Number | Hot Plate Annealing Time (h) | Aligned Exposure Doses (mJ/cm$^2$) |
|---|---|---|
| 14A | 0.5 | 49-61 |
| 14B | 1.0 | 47-61 |
| 14C | 2.0 | 41-61 |

Example 15

Directed Self-Assembly of P(S-b-MMA) by Hot Plate Annealing on Patterned Surface A silicon wafer was cleaned by immersion in CD26 for 10 minutes, rinsed with deionized water and blown dry under a stream of nitrogen. The cleaned wafer was immediately placed into a 10% (v/v) solution of $^n$BuSiCl$_3$ in toluene for 10 minutes. The wafer was then rinsed with toluene and blown dry under a stream of nitrogen. The surface modified wafer was stored for 2 days at room temperature in air and then patterned with the Lawrence Berkeley National Laboratory on a 0.30 NA microfield exposure tool as described above. The exposed wafer was stored for an additional day in air prior to further processing.

Polymer films were spun from a 0.9% (w/w) solution of Polymer A in toluene at 2600 rpm for 60 seconds, and then baked for 60 seconds at 130° C. on a hot plate as described above. The polymer film thickness was determined to be 45 nm. The polymer film was annealed at 260° C. on a hot plate in a nitrogen-filled glove box for 2 hours. After annealing, it was found that exposing wafer number 15 with an exposure dose of 300-400 mJ/cm$^2$ with the EUV radiation with a mask having 45-nm dense features provided enough surface energy differentiation to drive the block copolymer film alignment.

Example 16

Partial Polymer Removal and Subsequent Image Transfer

PMMA block removal was accomplished photochemically either with a 193-nm laser with a 500 mJ/cm² exposure dose or a 157-nm laser with a 31 mJ/cm² exposure dose. The block copolymer was then immersed in a 1:1 methyl isobutyl ketone:isopropanol developer for 60 seconds, rinsed with 1:1 methyl isobutyl ketone:isopropanol, and air dried. SEM analysis showed complete removal of the PMMA block occurred with either 193-nm or 157-nm exposure and that the styrene block remained as 45-nm lines with a 91-nm pitch that were 45-nm high.

The wafer containing only the styrene block as 45-nm lines was placed into a Perkin Elmer Reactive Ion Etcher and the underlying silicon was etched for 2.5 minutes using a 95:5 $SF_6:O_2$ mixture at 10 mTorr (15 sscm flow rate) with a 60 V bias. These process conditions gave an anisotropic etch into the silicon yielded 45-nm lines with a 91-nm pitch grating pattern into silicon that was 90 nm deep.

Example 17

Partial Polymer Removal and Subsequent Image Transfer

PMMA block removal was accomplished by reactive ion etching using an oxygen etch for 1 minute at 10 mTorr (15 sccm flow rate) with 100 V bias in a Perkin Elmer Reactive Ion Etcher. SEM analysis showed complete removal of the PMMA block and that the styrene block remained as 45-nm lines with a 91-nm pitch that were 13-nm high.

The wafer containing only the styrene block as 45-nm lines was placed into a Perkin Elmer Reactive Ion Etcher and the underlying silicon was etched for 1.0 minutes using a 95:5 $SF_6:O_2$ mixture at 10 mTorr (15 sscm flow rate) with a 60 V bias. These process conditions gave an anisotropic etch into the silicon and yielded a 45-nm lines with a 91-nm pitch grating pattern into silicon that was 34 nm deep.

Example 18

Surface Energies After 193-nm Exposure

Wafers coated with the surface modifying agents in Example 1 were exposed to a series of different exposure doses at 193 nm in the manner listed in General Exposure Conditions. Surface energies of each spot were measured as above. The data for representative points are summarized in Tables 16 and 17.

TABLE 16

| | Polar surface energy (dynes/cm). | | | | |
|---|---|---|---|---|---|
| | Dose (mJ/cm²) | | | | |
| $RSiCl_3$ | 0 | 100 | 400 | 2200 | 5000 |
| Bu— | 4.8 | 4.8 | 4.7 | 5.2 | 8.8 |
| Ph— | 4.8 | 6.6 | 15.4 | 30.3 | 39.9 |
| $CH_3$—Ph— | 3.8 | 10.1 | 27.8 | 42.9 | 42.9 |
| $PhCH_2CH_2$— | 4.8 | 6.0 | 14.6 | 29.4 | 39.8 |
| t-$BuPhCH_2CH_2$— | 0.6 | 1.3 | 5.4 | 25.4 | 37.3 |

TABLE 17

| | Dispersive surface energy (dynes/cm). | | | | |
|---|---|---|---|---|---|
| | Dose (mJ/cm²) | | | | |
| $RSiCl_3$ | 0 | 100 | 400 | 2200 | 5000 |
| Bu— | 27.1 | 27.1 | 27.4 | 27.7 | 28.7 |
| Ph— | 31.2 | 31.2 | 31.1 | 31.0 | 31.0 |
| $CH_3$-Ph— | 31.2 | 31.2 | 31.0 | 31.0 | 31.0 |
| $PhCH_2CH_2$— | 31.2 | 31.2 | 31.1 | 31.0 | 31.0 |
| t-$BuPhCH_2CH_2$— | 31.3 | 31.3 | 31.2 | 31.1 | 31.0 |

The example shows the exposure of films of aromatic-based surface modifying agents will change the polar surface energies based on exposure dose. The butyl-based surface modifying agents is not absorbing at 193 nm, and thus does not appreciably change polar surface energy upon exposure. All of the surface modifying agents do not appreciably change their dispersive surface energy throughout the exposure dose matrix.

Example 19

Low Defect Directed Self-Assembly

It is important to minimize or eliminate defects from directed self-assembly of diblock copolymers. Defects in directed self-assembly are primarily dislocation defects caused by an imperfect alignment of the diblock copolymer to the directing surface. These defect can be lines either bridging, terminating in a bridging of adjacent lines, or a line moving from one row to an adjacent row. Defects of less than 1 per μm² are desired. Examples of low or zero defects are shown in FIG. 4 along with an example of higher defects to illustrate types of dislocation defects. The example shows that this directed self-assembly technique is capable of very low defects.

Example 20

Directed Self-Assembly of P(S-b-MMA) by Hot Plate Annealing on an Electron Beam Patterned Surface A silicon wafer was cleaned by immersion in CD26 for 10 minutes, rinsed with deionized water and blown dry under a stream of nitrogen. The cleaned wafer was immediately placed into a 1% (v/v) solution of "$BuSiCl_3$ in toluene for 20 minutes. The wafer was then rinsed with toluene, blown dry under a stream of nitrogen, and baked on an hot plate at 120° C. for 5 minutes. The surface modified wafer was then patterned with the electron beam writer by writing a series of lines of 42.5 nm width with a pitch of 85 nm, followed by UV-ozone treatment for any one of 40, 45, or 50 seconds.

Polymer films were spun from a 0.9% (w/w) solution of Polymer A in toluene at 2600 rpm for 60 seconds, and then baked for 60 seconds at 130° C. on a hot plate as described above. The polymer film thickness was determined to be 45 nm. The polymer film was annealed at 260° C. on a hot plate in a nitrogen-filled glove box for 2 hours. The electron beam exposure doses that resulted in aligned polymer films after annealing can be found in Table 18.

TABLE 18

UV-ozone treatment times and exposure doses
which show aligned block copolymer films.

| Wafer Number | UV-ozone Treatment Time (s) | Aligned Exposure Doses ($\mu C/cm^2$) |
|---|---|---|
| 15A | 40 | 2800-3000 |
| 15B | 45 | 2400-3000 |
| 15C | 50 | 2400-3000 |

Example 21

Directed Self-Assembly of P(S-b-MMA) by Hot Plate Annealing on an Electron Beam Patterned Surface A silicon wafer was cleaned by immersion in CD26 for 10 minutes, rinsed with deionized water and blown dry under a stream of nitrogen. The cleaned wafer was immediately placed into a 1% (v/v) solution of "BuSiCl$_3$ in toluene for 20 minutes. The wafer was then rinsed with toluene, blown dry under a stream of nitrogen, and baked on a hot plate at 120° C. for 5 minutes. The surface modified wafer was then patterned with the electron beam writer by writing a series of lines of 22.5 nm width with a pitch of 45 nm followed by to UV-ozone treatment for either 40 or 45 seconds.

Polymer films were spun from a 1.9% (w/w) solution of Polymer C in toluene at 1350 rpm for 60 seconds, and then baked for 60 seconds at 130° C. on a hot plate as described above. The polymer film thickness was determined to be 45 nm. The polymer film was annealed at 220° C. on a hot plate in a nitrogen-filled glove box for 2 hours. The electron beam exposure doses that resulted in aligned polymer films after annealing can be found in Table 19.

TABLE 19

UV-ozone treatment times and exposure doses
which show aligned block copolymer films.

| Wafer Number | UV-ozone Treatment Time (s) | Aligned Exposure Doses ($\mu C/cm^2$) |
|---|---|---|
| 16A | 40 | 2400-3000 |
| 16B | 45 | 2400-3000 |

Example 22

Directed Self-Assembly of P(S-b-MMA) by Hot Plate Annealing on an Electron Beam Patterned Surface A silicon wafer was cleaned by immersion in CD26 for 10 minutes, rinsed with deionized water and blown dry under a stream of nitrogen. The cleaned wafer was immediately placed into a 1% (v/v) solution of "BuSiCl$_3$ in toluene for 20 minutes. The wafer was then rinsed with toluene, blown dry under a stream of nitrogen, and baked on a hot plate at 120° C. for 5 minutes. The surface modified wafer was then patterned with the electron beam writer by writing a series of lines of 22.5 nm width with a pitch of 45 nm followed by to UV-ozone treatment for 45 seconds.

Polymer films were spun from a 1.9% (w/w) solution of Polymer C in toluene at 1350 rpm for 60 seconds, and then baked for 60 seconds at 130° C. on a hot plate as described above. The polymer film thickness was determined to be 45 nm. The polymer film was annealed at 240° C. on a hot plate in a nitrogen-filled glove box for 2 hours. Aligned polymer films after annealing were observed for electron beam exposure doses between 2250 and 2500 $\mu C/cm^2$.

Example 23

Directed Self-Assembly of P(S-b-MMA) by Hot Plate Annealing on an Electron Beam Patterned Surface A silicon wafer was cleaned by immersion in CD26 for 10 minutes, rinsed with deionized water and blown dry under a stream of nitrogen. The cleaned wafer was immediately placed into a 1% (v/v) solution of "BuSiCl$_3$ in toluene for 20 minutes. The wafer was then rinsed with toluene, blown dry under a stream of nitrogen, and baked on a hot plate at 120° C. for 5 minutes. The surface modified wafer was then patterned with the electron beam writer by writing a series of lines of 22.5 nm width with a pitch of either 45 or 47.5 nm followed by to UV-ozone treatment for 45 seconds.

Polymer films were spun from a 1.9% (w/w) solution of Polymer C in toluene at 1350 rpm for 60 seconds, and then baked for 60 seconds at 130° C. on a hot plate as described above. The polymer film thickness was determined to be 45 nm. The polymer film was annealed at 240° C. on a hot plate in a nitrogen-filled glove box for 2 hours. The electron beam exposure doses that resulted in aligned polymer films after annealing can be found in Table 20.

TABLE 20

Electron beam writing pitches and exposure doses
which show aligned block copolymer films.

| Wafer Number | Electron Beam Writing Pitch (nm) | Aligned Exposure Doses ($\mu C/cm^2$) |
|---|---|---|
| 17A | 45 | 2375-2575 |
| 17B | 47.5 | 2285-2475 |

Example 24

Directed Self-Assembly of P(S-b-MMA) by Hot Plate Annealing on an Electron Beam Patterned Surface A silicon wafer was cleaned by immersion in CD26 for 10 minutes, rinsed with deionized water and blown dry under a stream of nitrogen. The cleaned wafer was immediately placed into a 1% (v/v) solution of "BuSiCl$_3$ in toluene for 20 minutes. The wafer was then rinsed with toluene, blown dry under a stream of nitrogen, and baked on a hot plate at 120° C. for 5 minutes. The surface modified wafer was then patterned with the electron beam writer by writing a series of lines of 22.5 nm width with a pitch of 47.5 nm followed by to UV-ozone treatment for 45 seconds.

Polymer films were spun from a 1.9% (w/w) solution of Polymer C in toluene at 1350 rpm for 60 seconds, and then baked for 60 seconds at 130° C. on a hot plate as described above to yield a polymer film thickness of 45 nm or spun at 3300 rpm for 60 seconds, and then baked for 60 seconds at 130° C. on a hot plate as described above to yield a polymer film thickness of 30 nm. The polymer film was annealed at 240° C. on a hot plate in a nitrogen-filled glove box for 2 hours. The electron beam exposure doses that resulted in aligned polymer films after annealing can be found in Table 21.

TABLE 21

Polymer film thicknesses and exposure doses which show aligned block copolymer films.

| Wafer Number | Polymer film Thickness (nm) | Aligned Exposure Doses ($\mu C/cm^2$) |
|---|---|---|
| 18A | 45 | 3500-4500 |
| 18B | 30 | 3500-4500 |

Example 25

Directed Self-Assembly of P(S-b-MMA) by Hot Plate Annealing on an Electron Beam Patterned Surface A silicon wafer was cleaned by immersion in CD26 for 10 minutes, rinsed with deionized water and blown dry under a stream of nitrogen. The cleaned wafer was immediately placed into a 1% (v/v) solution of $^n$BuSiCl$_3$ in toluene for 20 minutes. The wafer was then rinsed with toluene, blown dry under a stream of nitrogen, and baked on a hot plate at 120° C. for 5 minutes. The surface modified wafer was then patterned with the electron beam writer by writing a series of lines of 22.5 nm width with a pitch of 95 nm followed by to UV-ozone treatment for 45 seconds.

Polymer films were spun from a 1.9% (w/w) solution of Polymer C in toluene at 5000 rpm for 60 seconds, and then baked for 60 seconds at 130° C. on a hot plate as described above. The polymer film thickness was determined to be 25 nm. The polymer film was annealed at 260° C. on a hot plate in a nitrogen-filled glove box for 2 hours. Aligned polymer films after annealing were observed for an electron beam exposure dose of 5788 $\mu C/cm^2$. This result shows that diblock polymer assembly occurs without the need to pattern every line. Instead patterning a fraction of desired lines is sufficient to guide assembly of a desired structure.

Equivalents

While the present invention has been described in terms of specific methods, structures, and devices it is understood that variations and modifications will occur to those skilled in the art upon consideration of the present invention. For example, the methods and compositions discussed herein can be utilized beyond the preparation of metallic surfaces for implants in some embodiments. As well, the features illustrated or described in connection with one embodiment can be combined with the features of other embodiments. Such modifications and variations are intended to be included within the scope of the present invention. Those skilled in the art will appreciate, or be able to ascertain using no more than routine experimentation, further features and advantages of the invention based on the above-described embodiments. Accordingly, the invention is not to be limited by what has been particularly shown and described, except as indicated by the appended claims.

All publications and references are herein expressly incorporated by reference in their entirety. The terms "a" and "an" can be used interchangeably, and are equivalent to the phrase "one or more" as utilized in the present application. The terms "comprising," "having," "including," and "containing" are to be construed as open-ended terms (i.e., meaning "including, but not limited to,") unless otherwise noted. The phrase "at least one of X and Y" means X, Y, or X and Y. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

What is claimed is:

1. A method of directing assembly of a material using a surface-modified substrate, comprising:
   creating a modified surface on a substrate by applying a silicon-containing surface agent to the substrate, the modified surface characterized by a first surface energy;
   applying energy on the modified surface to form an imaged modified surface having an imaged portion and a non-imaged portion, the applied energy removing at least a portion of an attached surface agent from the imaged portion by breaking a bond between a silicon atom and another atom of the surface agent, the imaged portion characterized by a second surface energy differing from the first surface energy; and
   contacting a self assembling material to the surface modified substrate; the surface modified substrate directing assembly of the self assembling material to form a selected pattern based upon at least one of the first surface energy and the second surface energy.

2. The method of claim 1, wherein the selected pattern exhibits a defect density lower than about 1 per square micrometer.

3. The method of claim 1, wherein the self assembling material comprises a block copolymer.

4. The method of claim 3, wherein the selected pattern corresponds with at least one of the imaged portion and the non-imaged portion, the selected pattern exhibiting a substantially uniform block copolymer morphology.

5. The method of claim 3, wherein the block copolymer exhibits a structure having an axis of symmetry oriented substantially perpendicular to a surface of the substrate.

6. The method of claim 5, wherein the structure includes at least one of lamellae and cylinders.

7. The method of claim 1, wherein the surface agent comprises a non-polymeric agent.

8. The method of claim 1, wherein the surface agent comprises a silicon-containing agent capable of bonding to the substrate.

9. The method of claim 8, wherein the surface agent comprises a silicon-containing aryl agent.

10. The method of claim 8, wherein the surface agent comprises a silicon-containing substituted aliphatic agent.

11. The method of claim 8, wherein the attached surface agent comprises at least a portion of a molecule corresponding to Structural Formula I(b):

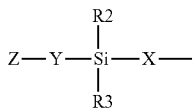

wherein
R2 and R3 are each independently any one of F, Cl, Br, I, OH, OM, OR, R, NR$_2$, SiR$_3$, NCO, CN, or OCOR;
M is a metal atom;
X is either NR or O;
each R is independently any one of an alkyl group, a vinyl group, an aryl group, a hydrogen, a haloalkyl group, a halovinyl group, or a haloaryl group;
Y is any one of an alkyl group, a vinyl group, an aryl group, a silane, a siloxane, a haloalkyl group, a halovinyl group, or a haloaryl group; and
Z is any one of F, Cl, Br, I, OH, OM, OR, R, NR$_2$, SiR$_3$, NCO, CN, OCOR, NCOR, PR$_2$, PROR, P(OR)$_2$, SR, SSR, SO$_2$R, or SO$_3$R.

12. The method of claim 11, wherein the removed portion of the attached surface agent comprises at least one of (Z-Y), R2, and R3.

13. The method of claim 8, wherein the attached surface agent comprises at least a portion of a molecule corresponding to Structural Formula II(b):

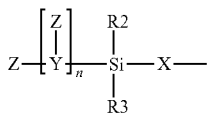

wherein
R2 and R3 are each independently any one of F, Cl, Br, I, OH, OM, OR, R, NR$_2$, SiR$_3$, NCO, CN, or OCOR;
M is a metal atom;
X is either NR or O;
n is an integer having a value of 1 or greater;
each R is independently any one of an alkyl group, a vinyl group, an aryl group, a hydrogen, a haloalkyl group, a halovinyl group, or a haloaryl group;
each Y is independently any one of an alkyl group, a vinyl group, an aryl group, a silane, a siloxane, a haloalkyl group, a halovinyl group, or a haloaryl group; and
each Z is independently any one of F, Cl, Br, I, OH, OM, OR, R, NR$_2$, SiR$_3$, NCO, CN, OCOR, NCOR, PR$_2$, PROR, P(OR)$_2$, SR, SSR, SO$_2$R, or SO$_3$R.

14. The method of claim 13, wherein the removed portion of the attached surface agent comprises at least one of Z—[Z—Y]$_n$, R2, and R3.

15. The method of claim 8, wherein the attached surface agent comprises at least a portion of a molecule corresponding to Structural Formula III(b):

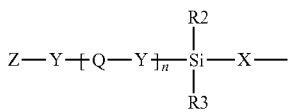

wherein
R2 and R3 are each independently any one of F, Cl, Br, I, OH, OM, OR, R, NR$_2$, SiR$_3$, NCO, CN, or OCOR;
M is a metal atom;
X is either NR or O;
n is an integer having a value of 1 or greater;
each Q is independently any one of O, NR, SiR$_2$, (O)CO, (N)CO, PR, POR, S, SS, SO$_2$, or SO$_3$;
each R is independently any one of an alkyl group, a vinyl group, an aryl group, a hydrogen, a haloalkyl group, a halovinyl group, or a haloaryl group;
each Y is independently any one of an alkyl group, a vinyl group, an aryl group, a silane, a siloxane, a haloalkyl group, a halovinyl group, or a haloaryl group; and
each Z is independently any one of F, Cl, Br, I, OH, OM, OR, R, NR$_2$, SiR$_3$, NCO, CN, OCOR, NCOR, PR$_2$, PROR, P(OR)$_2$, SR, SSR, SO$_2$R, or SO$_3$R.

16. The method of claim 15, wherein the removed portion of the attached surface agent comprises at least one of Z—Y—[Q—Y]$_n$, R2, and R3.

17. The method of claim 1, wherein the step of applying energy does not result in oxidation of the surface agent.

18. The method of claim 1, wherein the energy is characterized by at least one of radiation, an electron beam, and an ion beam.

19. The method of claim 1, wherein the energy is characterized by at least one of x-rays, EUV, and radiation exhibiting at least one wavelength greater than about 140 nm.

20. The method of claim 19, wherein the energy is characterized by light having at least one wavelength in a range greater than about 190 nm.

21. The method of claim 20, wherein the surface agent comprises an aryl-containing agent.

22. The method of claim 1, wherein the steps of creating a modified surface and applying energy are performed in an environment with an oxygen content below an amount of oxygen in about 0.01 Torr of air.

23. The method of claim 1, wherein the selected pattern formed by the self assembling material exhibits a first pitch and the imaged modified surface exhibits a second pitch, the second pitch being larger than the first pitch.

24. The method of claim 1, further comprising:
applying a second surface agent to the imaged portion and non-imaged portion of the modified surface, the second surface agent preferentially adhering to either the imaged portion or the non-imaged portion of the modified surface to thereby create a third surface energy; and
wherein the step of contacting the self assembling material to the surface modified substrate, further comprises directing assembly of the self assembling material to form a selected pattern based upon at least one of the first, second and third surface energies.

25. The method of claim 24, further comprising:
applying a third surface agent to the surface-modified substrate after the step of applying the second surface agent.

26. The method of claim 24, wherein the second surface agent comprises a silicon-containing agent capable of bonding to at least one of a modified substrate surface and an unmodified substrate surface.

27. The method of claim 24, wherein the second surface agent comprises a non-polymeric agent.

28. The method of claim 24, wherein the second surface agent comprises a silicon-containing agent capable of bonding to the modified surface.

29. The method of claim 28, wherein the second surface agent comprises a silicon-containing aryl-containing agent.

30. The method of claim 28, wherein the second surface agent comprises a silicon-containing substituted aliphatic agent.

31. After "The method of claim 28, wherein" and before "second surface agent comprises at least a portion...", delete "at least one of an attached first surface agent and an attached", add "the".

32. After "The method of claim 28, wherein" and before "second surface agent comprises at least a potion of...", delete "at least one of an attached first surface agent and an attached", add "the".

33. After "The method of claim 28, wherein" and before "second surface agent comprises at least a portion of...", delete "at least one of an attached first surface agent and an attached", add "the".

34. The method of claim 24, wherein the selected pattern formed by the self assembling material exhibits a first pitch and a second pitch.

* * * * *